United States Patent
Yamazawa

(10) Patent No.: US 9,627,181 B2
(45) Date of Patent: Apr. 18, 2017

(54) PLASMA PROCESSING APPARATUS

(75) Inventor: Yohei Yamazawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1024 days.

(21) Appl. No.: 13/246,049

(22) Filed: Sep. 27, 2011

(65) Prior Publication Data

US 2012/0073756 A1 Mar. 29, 2012

Related U.S. Application Data

(60) Provisional application No. 61/391,952, filed on Oct. 11, 2010.

(30) Foreign Application Priority Data

Sep. 28, 2010 (JP) ................................ 2010-216996

(51) Int. Cl.
| | | |
|---|---|---|
| C23C 16/00 | (2006.01) | |
| C23F 1/00 | (2006.01) | |
| H01L 21/306 | (2006.01) | |
| H01J 37/32 | (2006.01) | |

(52) U.S. Cl.
CPC ......... *H01J 37/321* (2013.01); *H01J 37/3211* (2013.01)

(58) Field of Classification Search
CPC ....... H01J 37/321; H01J 37/3211; H05H 1/46
USPC ........ 156/345.48, 345.49; 118/723 I, 723 IR, 118/723 AN; 315/111.51
See application file for complete search history.

(56) References Cited

U.S. PATENT DOCUMENTS

| | | | |
|---|---|---|---|
| 5,759,280 A * | 6/1998 | Holland et al. | ............ 118/723 I |
| 5,800,619 A | 9/1998 | Holland et al. | |
| 6,288,493 B1 | 9/2001 | Lee et al. | |
| 6,414,648 B1 * | 7/2002 | Holland et al. | ................ 343/895 |
| 7,442,273 B2 * | 10/2008 | Kwon et al. | ............. 156/345.48 |

(Continued)

FOREIGN PATENT DOCUMENTS

| | | |
|---|---|---|
| CN | 1392754 A | 1/2003 |
| CN | 1689132 A | 10/2005 |

(Continued)

OTHER PUBLICATIONS

English Machine Translation JP2004363247, Tamura et al, Dec. 24, 2004.*

*Primary Examiner* — Rakesh Dhingra
(74) *Attorney, Agent, or Firm* — Pearne & Gordon LLP

(57) ABSTRACT

There is provided an inductively coupled plasma etching apparatus capable of suppressing a wavelength effect within a RF antenna and performing a plasma process uniformly in both a circumferential and a radial direction. In the plasma etching apparatus, a RF antenna 54 is provided on a dielectric window 52 to generate inductively coupled plasma. The RF antenna 54 includes an inner coil 58, an intermediate coil 60 and an outer coil 62 in the radial direction. The inner coil 58 includes a single inner coil segment 59 or more than one inner coil segments 59 connected in series. The intermediate coil 60 includes two intermediate coil segments 61(1) and 61(2) separated in a circumferential direction and electrically connected with each other in parallel. The outer coil 62 includes three outer coil segments 63(1), 63(2) and 63(3) separated in a circumferential direction and electrically connected with each other in parallel.

24 Claims, 14 Drawing Sheets

(56) References Cited

U.S. PATENT DOCUMENTS

| | | | |
|---|---|---|---|
| 2002/0007794 A1* | 1/2002 | Byun et al. | ............... 118/723 I |
| 2002/0189763 A1 | 12/2002 | Kwon et al. | |
| 2004/0085246 A1 | 5/2004 | Howald et al. | |
| 2004/0124779 A1* | 7/2004 | Howald | ............ H01J 37/32183 |
| | | | 315/111.51 |
| 2004/0255864 A1 | 12/2004 | Jeon et al. | |
| 2006/0175016 A1* | 8/2006 | Edamura et al. | ........ 156/345.48 |
| 2008/0168945 A1 | 7/2008 | Kim | |
| 2010/0066251 A1* | 3/2010 | Nakagami et al. | ...... 315/111.51 |

FOREIGN PATENT DOCUMENTS

| | | | |
|---|---|---|---|
| CN | 1726745 A | | 1/2006 |
| JP | 10-064697 A | | 3/1998 |
| JP | 2002-008996 A | | 1/2002 |
| JP | 2002-508883 A | | 3/2002 |
| JP | 2004-363247 | * | 12/2004 |
| JP | 2012-074464 A | | 4/2012 |
| WO | 99/01887 A1 | | 1/1999 |
| WO | 2008/065744 A1 | | 6/2008 |

* cited by examiner (ELECTRON DENSITY DISTRIBUTION WITHIN DONUT-SHAPED PLASMA)

(COMPARATIVE EXAMPLE)

PLASMA PROCESSING APPARATUS

CROSS-REFERENCE TO RELATED APPLICATION

This application claims the benefit of Japanese Patent Application No. 2010-216996 filed on Sep. 28, 2010 and U.S. Provisional Application Ser. No. 61/391,952 filed on Oct. 11, 2010, the entire disclosures of which are incorporated herein by reference.

FIELD OF THE INVENTION

The present disclosure relates to a technique for performing a plasma process on a processing target substrate; and, more particularly, to an inductively coupled plasma processing apparatus.

BACKGROUND OF THE INVENTION

In a manufacturing process of a semiconductor device or a FPD (Flat Panel Display), plasma is used to perform a process, such as etching, deposition, oxidation or sputtering, so as to perform a good reaction of a processing gas at a relatively low temperature. Conventionally, plasma generated by a high frequency electric discharge in MHz frequency band has been used in this kind of plasma process. The plasma generated by the high frequency electric discharge is largely divided into capacitively coupled plasma and inductively coupled plasma according to a plasma generation method (in view of an apparatus).

Generally, in an inductively coupled plasma processing apparatus, at least a part (for example, a ceiling) of walls of a processing chamber may have a dielectric window, and a high frequency power is supplied to a coil-shaped RF antenna positioned at an outside of this dielectric window. The processing chamber serves as a depressurizable vacuum chamber, and a target substrate (for example, a semiconductor wafer and a glass substrate) is provided at a central region within the chamber. A processing gas is supplied into a processing space formed between the dielectric window and the substrate. A high frequency AC magnetic field having magnetic force lines is generated around the RF antenna by a high frequency current flowing in the RF antenna. The magnetic force lines of the high frequency AC magnetic field are transmitted to the processing space within the chamber via the dielectric window. As the RF magnetic field of the high frequency AC magnetic field changes with time, an inductive electric field is generated in an azimuth direction within the processing space. Then, electrons accelerated by this inductive electromagnetic field in the azimuth direction collide with molecules or atoms of the processing gas so as to be ionized. In this process, a donut-shaped plasma may be generated.

Since a large processing space is formed within the chamber, the donut-shaped plasma can be diffused efficiently in all directions (particularly, in a radial direction) and a plasma density on the substrate becomes very uniform. However, only with a conventional RF antenna, the plasma density on a substrate is not sufficiently uniform for most plasma processes. In the plasma process, it is also one of the important issues to improve uniformity of a plasma density on a substrate since a uniformity/reproducibility and a production yield of a plasma process depend on the plasma uniformity.

In the inductively coupled plasma processing apparatus, a characteristic (profile) of plasma density distribution within the donut-shaped plasma formed in the vicinity of the dielectric window within the chamber is important. Especially, the profile of plasma density distribution affects characteristics (especially, uniformity) of plasma density distribution on the substrate after the diffusion of the plasma.

In this regard, there have been proposed several methods for improving uniformity of plasma density distribution in a circumferential direction by dividing the RF antenna into a multiple number of circular ring-shaped coils each having different diameter. There are two types of RF antenna division methods: a first type of connecting the multiple number of circular ring-shaped coils in series (see, for example, Patent Document 1) and a second type of connecting the multiple number of circular ring-shaped coils in parallel (see, for example, Patent Document 2).

Patent Document 1: U.S. Pat. No. 5,800,619
Patent Document 2: U.S. Pat. No. 6,288,493

In accordance with the first type method among the aforementioned conventional RF antenna division methods, since an entire coil length of the RF antenna is large as a sum of all the coils, a voltage drop within the RF antenna may be fairly large and not negligible. Further, due to a wavelength effect, a standing wave of electric current having a node in the vicinity of a RF input terminal of the RF antenna may be easily formed. For these reasons, in accordance with this first type method, it may be difficult to achieve uniformity of plasma density distribution in a diametrical direction as well as in a circumferential direction. Thus, the first type method is deemed to be inadequate for a plasma process for which large-diameter plasma is necessary.

Meanwhile, in the second type method, a RF current supplied to the RF antenna from a high frequency power supply may flow in a greater amount through an inner coil having a smaller diameter (i.e., smaller impedance), whereas a relatively small amount of RF current may flow through an outer coil having a larger diameter (i.e., larger impedance) within the RF antenna. Accordingly, plasma density within the chamber may be high at a central portion of the chamber in a radial direction while the plasma density may be low at a peripheral portion thereof. Thus, in the second type method, capacitors for adjusting impedance are additionally coupled to the respective coils within the RF antenna so as to adjust a split ratio of the RF current flowing through the respective coils.

In such a case, if a capacitor for adjusting impedance is provided on a return line or an earth line of the high frequency power supply, i.e., on an end of the RF antenna, an electric potential of a coil may become higher than a ground potential, so that a sputtering effect causing damage and degradation of the dielectric window by ion attack from the plasma can be suppressed. However, since the coil of the RF antenna is electrically terminated through the capacitor, a length of an equivalent short-circuit resonance line is shortened. As a result, a wavelength effect may easily occur in the outer coil having the larger diameter (length). Therefore, there may occur the same problem as mentioned in the first type method.

BRIEF SUMMARY OF THE INVENTION

In view of the above, the present disclosure provides an inductively coupled plasma processing apparatus capable of suppressing a wavelength effect within a RF antenna, and also capable of performing a plasma process uniformly both in a circumferential direction and in a radial direction.

In accordance with one embodiment of the present disclosure, there is provided a plasma processing apparatus including a processing chamber having a dielectric window; a substrate holding unit for holding thereon a processing target substrate within the processing chamber; a processing gas supply unit configured to supply a processing gas into the processing chamber in order to perform a plasma process on the substrate; a RF antenna provided outside the dielectric window in order to generate plasma of the processing gas within the processing chamber by inductive coupling; and a high frequency power supply unit configured to supply a high frequency power having a frequency for generating a high frequency electric discharge of the processing gas. Here, the RF antenna may include an inner coil, an intermediate coil and an outer coil with gaps therebetween in a radial direction. Further, the inner coil may include a single inner coil segment or more than one inner coil segments connected in series. Furthermore, the intermediate coil may include multiple intermediate coil segments separated in a circumferential direction and electrically connected with each other in parallel. Moreover, the outer coil may include multiple outer coil segments separated in a circumferential direction and electrically connected with each other in parallel.

In accordance with the plasma processing apparatus of the present disclosure, the RF antenna may include the inner coil, the intermediate coil and the outer coil in the radial direction. Further, the intermediate coil may include the multiple intermediate coil segments separated in the circumferential direction, and the outer coil may include the multiple outer coil segments separated in the circumferential direction. Here, the intermediate coil segments may be electrically connected with each other in parallel, and the outer coil segments may be electrically connected with each other in parallel. In such a configuration, a wavelength effect or a voltage drop within the RF antenna may depend on the length of each of the coil segments. Accordingly, the coil segment number or the coil segment length within each coil may be set so as not to allow the occurrence of the wavelength effect within the individual coil segments and so as not to increase the voltage drop.

In accordance with the plasma processing apparatus of the present disclosure, an intermediate capacitor is electrically connected with the intermediate coil in series between a first node at the side of the high frequency power supply unit and a second node at a ground potential side. This intermediate capacitor may be a variable capacitor. Further, when high frequency power transmission lines are extended continuously from the first node to the second node, a winding direction of the intermediate coil on the high frequency power transmission line may be opposite to winding directions of the inner coil and the outer coil on the high frequency power transmission lines in the circumferential direction.

With this configuration, an electrostatic capacitance of the intermediate capacitor may be varied within a range in which a combined reactance of the intermediate coil segments of the intermediate coil and the intermediate capacitor has a negative value. Accordingly, a direction of an intermediate current flowing in the intermediate coil may be equal to directions of an inner current and an outer current respectively flowing in the inner coil and the outer coil in the circumferential direction. Further, it may be possible to gradually increase a magnitude of the intermediate current from about zero, and it may be also possible to set the magnitude of the intermediate current to have a sufficiently smaller value than the inner current and the outer current. As a result, it may be possible to easily control plasma density distribution.

Further, in accordance with the plasma processing apparatus of the present disclosure, an inner capacitor or an outer capacitor may be provided between the first node and the second node. The inner capacitor or the outer capacitor may be electrically connected with at least one of the inner coil segment and the outer coil segments in series. The inner capacitor or the outer capacitor may be a variable capacitor. By varying an electrostatic capacitance of the inner capacitor or the outer capacitor, a balance between an inner current flowing in the inner coil and an outer current flowing in the outer coil can be adjusted.

In accordance with the plasma processing apparatus of the present disclosure, by using the above-described configuration and operation, it may be possible to suppress a wavelength effect within the RF antenna. Furthermore, it may be also possible to perform the plasma process uniformly both in the circumferential direction and in the radial direction.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Hereinafter, the embodiments of the present disclosure will be described in detail with reference to the accompanying drawings.

[Entire Configuration and Operation of Apparatus]

Figure 1:
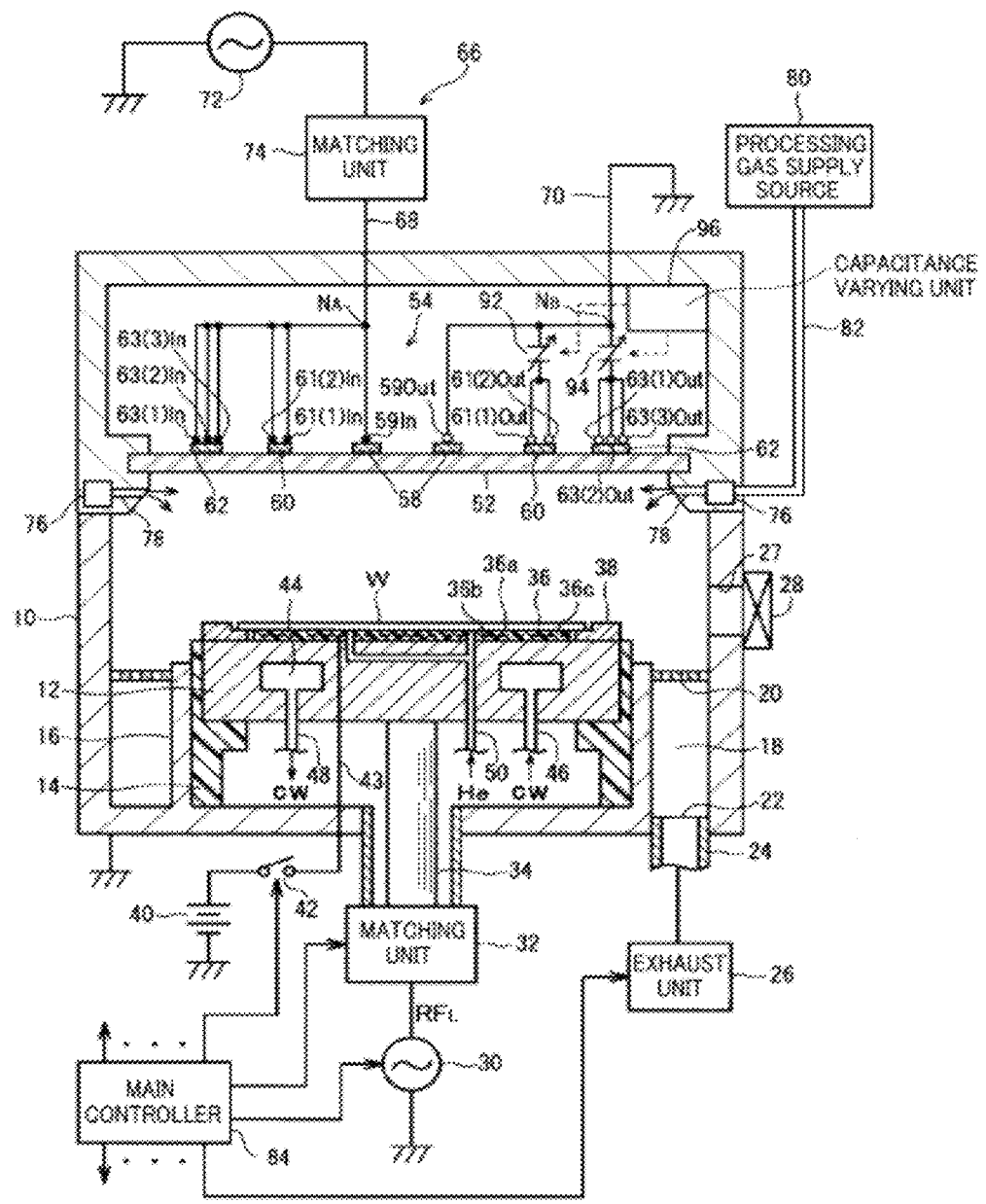
FIG. 1 is a longitudinal cross sectional view showing a configuration of an inductively coupled plasma etching apparatus in accordance with an embodiment of the present disclosure.

FIG. 1 illustrates a configuration of an inductively coupled plasma processing apparatus in accordance with an embodiment of the present disclosure.

This plasma processing apparatus is configured as an inductively coupled plasma etching apparatus using a planar coil RF antenna. By way of example, the plasma etching apparatus may include a cylindrical vacuum chamber (processing chamber) 10 made of metal such as aluminum or stainless steel. The chamber 10 may be frame grounded.

Above all, there will be explained a configuration of each component which is not related to plasma generation in this inductively coupled plasma etching apparatus.

At a lower central region within the chamber 10, a circular plate-shaped susceptor 12 may be provided horizontally. The susceptor 12 may mount thereon a target substrate such as a semiconductor wafer W and may serve as a high frequency electrode as well as a substrate holder. This susceptor 12 may be made of, for example, aluminum and may be supported by a cylindrical insulating support 14 which may be extended uprightly from a bottom of the chamber 10.

Between a cylindrical conductive support 16 which is extended uprightly from a bottom of the chamber 10 along the periphery of the cylindrical insulating support 14 and an inner wall of the chamber 10, an annular exhaust line 18 may be provided. Further, an annular baffle plate 20 may be provided at an upper portion or an inlet of the exhaust line 18. Further, an exhaust port 22 may be provided at a bottom portion. In order for a gas flow within the chamber 10 to be uniformized with respect to an axis of the semiconductor wafer W on the susceptor 12, multiple exhaust ports 22 equi-spaced from each other along a circumference may be provided. Each exhaust port 22 may be connected to an exhaust unit 26 via an exhaust pipe 24. The exhaust unit 26 may include a vacuum pump such as a turbo molecular pump or the like. Thus, it may be possible to depressurize a plasma generation space within the chamber 10 to a required vacuum level. At an outside of a sidewall of the chamber 10, a gate valve 28 configured to open and close a loading/unloading port 27 of the semiconductor wafer W may be provided.

The susceptor 12 may be electrically connected to a high frequency power supply 30 for RF bias via a matching unit 32 and a power supply rod 34. This high frequency power supply 30 may be configured to output a variable high frequency power $RF_L$ having an appropriate frequency (typically, about 13.56 MHz or less) to control energies of ions attracted into the semiconductor wafer W. The matching unit 32 may accommodate a variable reactance matching circuit for performing matching between an impedance of the high frequency power supply 30 and an impedance of a load (mainly, susceptor, plasma and chamber). The matching circuit may include a blocking capacitor configured to generate a self-bias.

An electrostatic chuck 36 for holding the semiconductor wafer W by an electrostatic attraction force may be provided on an upper surface of the susceptor 12. Further, a focus ring 38 may be provided around the electrostatic chuck 36 to annularly surround the periphery of the semiconductor wafer W. The electrostatic chuck 36 may be formed by placing an electrode 36a made of a conductive film between a pair of insulating films 36b and 36c. A high voltage DC power supply 40 may be electrically connected to the electrode 36a via a switch 42 and a coated line 43. By applying a high DC voltage from the DC power supply 40, the semiconductor wafer W can be attracted to and held on the electrostatic chuck 36 by the electrostatic force.

A coolant cavity or a coolant path 44 of, e.g., a circular ring-shape, may be formed within the susceptor 12. A coolant, such as cooling water cw, having a certain temperature may be supplied into and circulated through the coolant path 44 from a chiller unit (not illustrated) via lines 46 and 48. By adjusting the temperature of the cooling water cw, it may be possible to control a process temperature of the semiconductor wafer W held on the electrostatic chuck 36. Further, a heat transfer gas, such as a He gas, may be supplied from a heat transfer gas supply unit (not illustrated) into a space between an upper surface of the electrostatic chuck 36 and a rear surface of the semiconductor wafer W through a gas supply line 50. Furthermore, an elevating mechanism (not shown) including lift pins configured to move up and down vertically through the susceptor 12 may be provided to load and unload the semiconductor wafer W.

Hereinafter, there will be explained a configuration of each component which is related to plasma generation in this inductively coupled plasma etching apparatus.

A ceiling or a ceiling plate of the chamber 10 may be separated relatively far from the susceptor 12. A circular dielectric window 52 formed of, for example, a quartz plate may be airtightly provided as the ceiling plate. Above the dielectric window 52, an antenna chamber 56 may be provided as a part of the chamber 10. The antenna chamber 56 may accommodate therein a RF antenna 54 and shield this RF antenna 54 from the outside. Here, the RF antenna 54 may generate inductively coupled plasma within the chamber 10.

The RF antenna 54 is provided in parallel to the dielectric window 52. The RF antenna 54 may include an inner coil 58, an intermediate coil 60 and an outer coil 62 with a certain gap therebetween in a radial direction. In the present embodiment, the inner coil 58, the intermediate coil 60 and the outer coil 62 have a circular ring shape and are coaxially arranged. Further, the inner coil 58, intermediate coil 60 and the outer coil 62 are also arranged concentrically with each other as well as with the chamber 10 or the susceptor 12.

In the present disclosure, the term "coaxial" means that central axes of multiple objects having axisymmetric shape are aligned with each other. As for multiple coils, respective coils surfaces may be offset with each other in an axial direction or may be aligned on the same plane (positioned concentrically).

Further, the inner coil 58, the intermediate coil 60 and the outer coil 62 are electrically connected in parallel between a high frequency power supply line 68 from a high frequency power supply unit 66 for plasma generation and a return line 70 toward a ground potential member (i.e., between two nodes $N_A$ and $N_B$). Here, the return line 70 as an earth line is grounded and is connected with a ground potential member (for example, the chamber 10 or other member) that is electrically maintained at a ground potential.

A variable capacitor 92 is provided between the node $N_B$ on the earth line 70 and the intermediate coil 60. Further, a variable capacitor 94 is provided between the node $N_B$ on the earth line 70 and the outer coil 62. Capacitances of these variable capacitors 92 and 94 may be independently adjusted to a desired value within a certain range by a capacitance varying unit 96 under the control of a main controller 84. Hereinafter, a capacitor connected in series to the inner coil 58 will be referred to as an "inner capacitor"; a capacitor connected in series to the intermediate coil 60 will be referred to as an "intermediate coil"; and a capacitor connected in series to the outer coil 62 will be referred to as an "outer capacitor." All these capacitors are provided between the node $N_A$ and $N_B$.

The high frequency power supply unit 66 may include a high frequency power supply 72 and a matching unit 74. The high frequency power supply 72 is capable of outputting a variable high frequency power $RF_H$ having a frequency (typically, equal to or higher than about 13.56 MHz) for generating plasma by an inductively coupled high frequency electric discharge. The matching unit 74 has a reactance-variable matching circuit for performing matching between an impedance of the high frequency power supply 72 and an impedance of load (mainly, RF antenna or plasma).

A processing gas supply unit for supplying a processing gas into the chamber 10 may include an annular manifold or buffer unit 76; multiple sidewall gas discharge holes 78; and a gas supply line 82. The buffer unit 76 may be provided at an inside (or outside) of the sidewall of the chamber 10 to be located at a position slightly lower than the dielectric window 52. The sidewall gas discharge holes 78 may be formed along a circumference at a regular interval and opened to the plasma generation space from the buffer unit 76. The gas supply line 82 may be extended from a processing gas supply source 80 to the buffer unit 76. The processing gas supply source 80 may include a flow rate controller and an opening/closing valve (not shown).

The main controller 86 may include, for example, a micro computer and may control an operation of each component within this plasma etching apparatus, for example, the exhaust unit 26, the high frequency power supplies 30 and 72, the matching units 32 and 74, the switch 42 for the electrostatic chuck, the variable capacitors 92 and 94, the processing gas supply source 80, the chiller unit (not shown), and the heat transfer gas supply unit (not shown) as well as a whole operation (sequence) of the apparatus.

In order to perform an etching process in this inductively coupled plasma etching apparatus, when the gate valve 28 becomes open, the semiconductor wafer W as a process target may be loaded into the chamber 10 and mounted on the electrostatic chuck 36. Then, after closing the gate valve 28, an etching gas (generally, an mixture gas) may be introduced into the chamber 10 from the processing gas supply source 80 via the gas supply line 82, the buffer unit 76, and the sidewall gas discharge holes 78 at a certain flow rate and a flow rate ratio. Subsequently, an internal pressure of the chamber 10 may be controlled to be a certain level by the exhaust unit 26. Further, the high frequency power supply 72 of the high frequency power supply unit 66 is turned on, and the high frequency power $RF_H$ for plasma generation is outputted at a certain RF power level. A current of the high frequency power $RF_H$ is supplied to the inner coil 58, the intermediate coil 60 and the outer coil 62 of the RF antenna 54 through the matching unit 74, the RF power supply line 68 and the return line 70. Meanwhile, the high frequency power supply 30 may be turned on to output the high frequency power $RF_L$ for ion attraction control at a certain RF power level. This high frequency power $RF_L$ may be applied to the susceptor 12 via the matching unit 32 and the lower power supply rod 34. Further, a heat transfer gas (a He gas) may be supplied to a contact interface between the electrostatic chuck 36 and the semiconductor wafer W from the heat transfer gas supply unit. Furthermore, the switch is turned on, and then, the heat transfer gas may be confined in the contact interface by the electrostatic force of the electrostatic chuck 36.

Within the chamber 10, an etching gas discharged from sidewall gas discharge holes 78 is diffused into a processing space below the dielectric window 52. By the current of the high frequency power $RF_H$ flowing in the coils 58, 60 and 62, magnetic force lines (magnetic flux) generated around these coils are transmitted to the processing space (plasma generation space) within the chamber 10 via the dielectric window 52. An induced electric field may be generated in an azimuth direction within the processing space. Then, electrons accelerated by this induced electric field in the azimuth direction may collide with molecules or atoms of the etching gas so as to be ionized. In the process, a donut-shaped plasma may be generated.

Radicals or ions in the donut-shaped plasma may be diffused in all directions within the large processing space. To be specific, while the radicals are isotropically introduced and the ions are attracted by a DC bias, the radicals and the ions may be supplied on an upper surface (target surface) of the semiconductor wafer W. Accordingly, plasma active species may perform chemical and physical reactions on the target surface of the semiconductor wafer W so as to etch a target film into a required pattern.

Herein, "a donut-shaped plasma" is not limited to only a ring-shaped plasma which is generated only at the radial outside in the chamber 10 without being generated at the radial inside (at a central area) therein. Further, "a donut-shaped plasma" may include a state where a volume or a density of the plasma generated at the radial outside is greater than that at the radial inside. Further, depending on a kind of a gas used for the processing gas, an internal pressure of the chamber 10, or the like, the plasma may have other shapes instead of "a donut shape".

In this inductively coupled plasma etching apparatus, the inner coil 58, the intermediate coil 60 and the outer coil 62 are configured to have specific spatial layout and electric connection to be described below. Further, by adding the capacitors (variable capacitors 92 and 94 in the example of FIG. 1) to the RF antenna 54, a wavelength effect or a potential difference (voltage drop) within the RF antenna 54 can be effectively suppressed or reduced. Thus, it is possible to uniformize plasma process characteristics on the semiconductor wafer W, that is, etching characteristics (etching rate, selectivity or etching profile) both in a circumferential direction and in a radial direction.

[Basic Configuration and Operation of RF Antenna]

Major characteristics of this inductively coupled plasma etching apparatus include the internal spatial layout and electric connection of the RF antenna 54.

Figure 2:
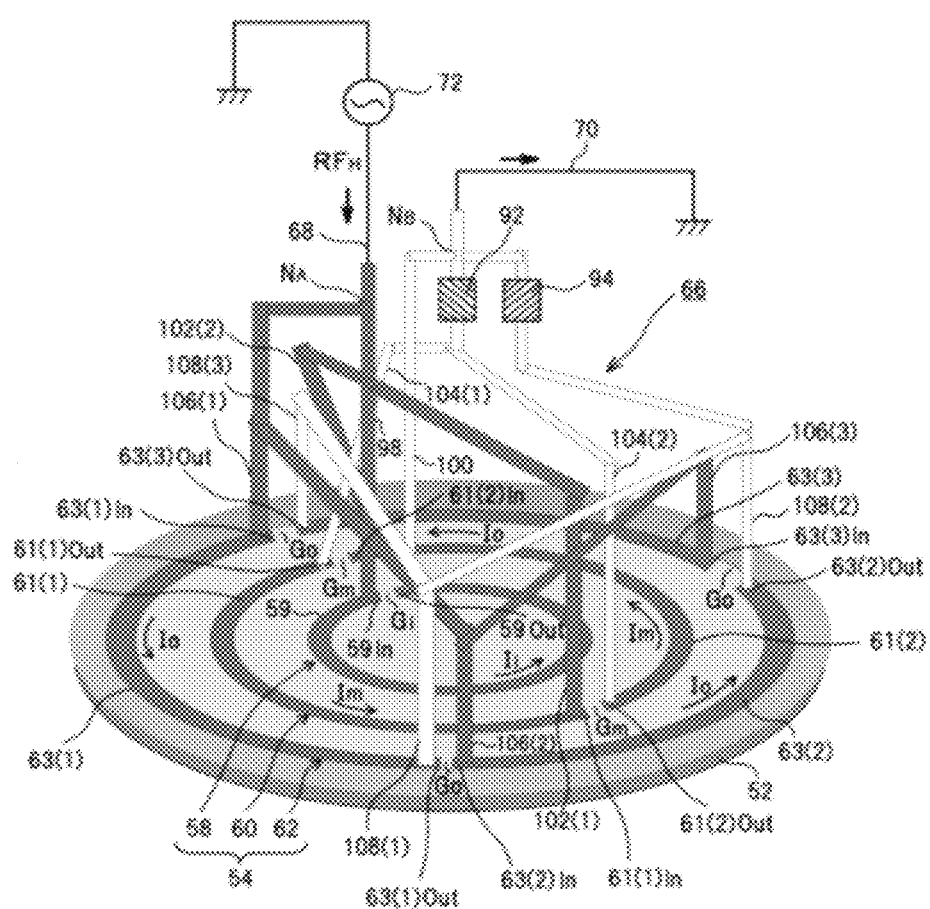
FIG. 2 is a perspective view illustrating a basic layout and an electric connection of a RF antenna in accordance with the embodiment of the present disclosure.
Figure 3:
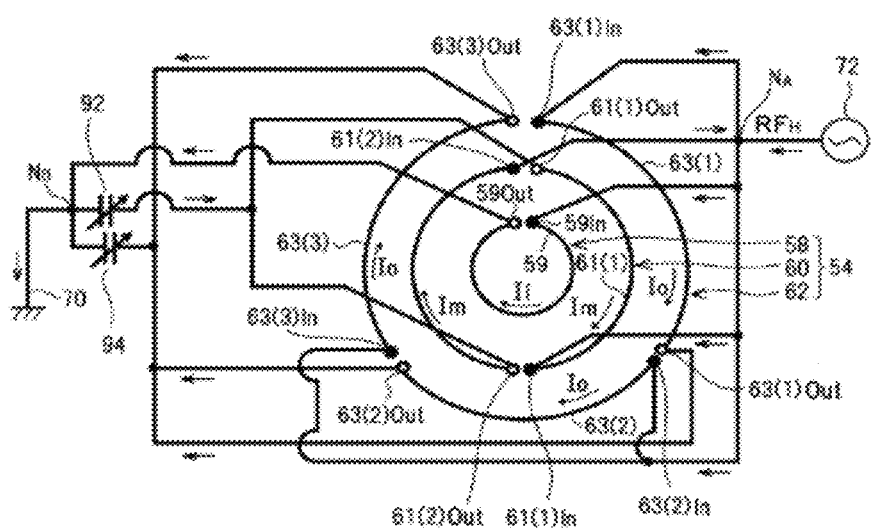
FIG. 3 is an electric connection diagram corresponding to the configuration of FIG. 2.
Figure 3:
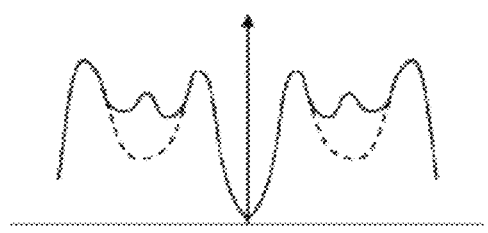

FIGS. 2 and 3 illustrate a basic configuration of the layout and the electric connection (circuit) of the RF antenna 54 in accordance with the embodiment of the present disclosure.

The inner coil 58 may include a single circular ring-shaped coil segment 59, and may be located near a center of the chamber 10 in the radial direction. Below, an each coil segment of the inner coil 58 will be referred to as an "inner coil segment." This inner coil segment 59 is a single body and is annularly extended along one round in a circumference direction or along the most of one round in the circumference direction. Both ends 59In and 59Out of the inner coil segment 59 are positioned adjacently or face to each other with an inner gap $G_i$ therebetween in the circumferential direction. In the present disclosure, a gap or a space formed in the loop of the inner coil 58 is referred to as an "inner gap."

One end of the inner coil segment 59, i.e., the RF input terminal 59In is connected with the RF power supply line 68 led from the high frequency power supply unit 66 via a connection conductor 98 and the first node $N_A$. The other end of the inner coil segment 59, i.e., the RF output terminal 59Out is connected with the earth line 70 via an upwardly extending connection conductor 100 and the second node $N_B$.

The intermediate coil 60 may include a multiple number of (e.g., two) coil segments 61(1) and 61(2) separated in a circumferential direction. The intermediate coil 60 is located at a middle position of the chamber 10 in the radial direction. Hereinafter, each coil segment of the intermediate coil 60 will be referred to as an "intermediate coil segment."

Spatially, each of these two intermediate coil segments 61(1) and 61(2) has a semicircular shape. These two intermediate coil segments 61(1) and 61(2) are arranged in series to be extended along one round in the circumferential direction or along the most of one round in the circumference direction. To elaborate, in an one-round loop of the intermediate coil 60, a RF input terminal 61(1)In of the first intermediate coil segment 61(1) and a RF output terminal 61(2)Out of the second intermediate coil segment 61(2) are positioned adjacently or face to each other with an intermediate gap $G_m$ therebetween in the circumferential direction. Further, a RF output terminal 61(1)Out of the first intermediate coil segment 61(1) and a RF input terminal 61(2)In of the second intermediate coil segment 61(2) are positioned adjacently or face to each other with another intermediate gap $G_m$ therebetween in the circumferential direction. In the present disclosure, a gap or a space formed in the loop of the intermediate coil 60 will be referred to as an "intermediate gap."

One ends of the intermediate coil segments 61(1) and 61(2), i.e., the RF input terminals 61(1)In and 61(2)In are electrically connected with the RF power supply line 68 led from the high frequency power supply unit 66 via upwardly extending connection conductors 102(1) and 102(2) and the first node $N_A$, respectively. Further, the other ends of the intermediate coil segments 61(1) and 61(2), i.e., the RF output terminals 61(1)Out and 61(2)Out are electrically connected with the earth line 70 via upwardly extending connection conductors 104(1) and 104(2) and the second node $N_B$, respectively.

The outer coil 62 may include a multiple number of (e.g., three) coil segments 63(1), 63(2) and 63(3) separated in a circumferential direction. The outer coil 62 is located near the sidewall of the chamber 10 in the radial direction. Hereinafter, each coil segment of the outer coil 62 will be referred to as an "outer coil segment."

Spatially, each of three outer coil segments 63(1), 63(2) and 63(3) is formed in about ⅓ circular arc shape. These three outer coil segments 63(1), 63(2) and 63(3) are arranged in series to be extended along one round in the circumferential direction or along the most of one round in the circumference direction. To elaborate, in an one-round loop of the outer coil 62, a RF input terminal 63(1)In of the first outer coil segment 63(1) and a RF output terminal 63(3)Out of the third outer coil segment 63(3) are positioned adjacently or face to each other with an outer gap $G_o$ therebetween in the circumferential direction. Further, a RF output terminal 63(1)Out of the first outer coil segment 63(1) and a RF input terminal 63(2)In of the second outer coil segment 63(2) are positioned adjacently or face to each other with another outer gap $G_o$ therebetween in the circumferential direction. Furthermore, a RF output terminal 63(2)Out of the second outer coil segment 63(2) and a RF input terminal 63(3)In of the third outer coil segment 63(3) are positioned adjacently or face to each other with the other outer gap $G_o$ therebetween in the circumferential direction. In the present disclosure, a gap or a space formed in the loop of the outer coil 62 will be referred to as an "outer gap."

One ends of the outer coil segments 63(1), 63(2) and 63(3), i.e., the RF input terminals 63(1)In, 63(2)In and 63(3)In are electrically connected with the RF power supply line 68 led from the high frequency power supply unit 66 via upwardly extending connection conductors 106(1), 106(2) and 106(3) and the first node $N_A$, respectively. Further, the other ends of the outer coil segments 63(1), 63(2) and 63(3), i.e., the RF output terminals 63(1)Out, 63(2)Out and 63(3)Out are electrically connected with the earth line 70 via upwardly extending connection conductors 108(1), 108(2) and 108(3) and the second node $N_B$, respectively.

In this way, between the RF power supply line 68 of the high frequency power supply unit 66 and the earth line 70 or between the first node $N_A$ and the second node $N_B$, the two intermediate coil segments 61(1) and 61(2) of the intermediate coil 60 are electrically connected to each other in parallel; the three outer coil segments 63(1), 63(2) and 63(3) of the outer coil 62 are electrically connected to each other in parallel; and the single inner coil segment 59 of the inner coil 58 is electrically connected in parallel to the intermediate coil segments 61(1) and 61(2) and the outer coil segments 63(1), 63(2) and 63(3). Further, the respective components of the RF antenna are connected such that directions of high frequency currents flowing in the intermediate coil segments 61(1) and 61(2) are all same in the circumferential direction, and directions of high frequency currents flowing in the outer coil segments 63(1), 63(2) and 63(3) are also all same in the circumferential direction.

The above-described coil connection configuration of the RF antenna 54 has an important feature. That is, when a high frequency transmission lines are continuously extended from the high frequency power supply line 68 of the high frequency power supply unit 66 to the earth line 70, a winding direction of the intermediate coil 60 on the high frequency power transmission line (clockwise direction in FIG. 2, and counterclockwise direction in FIG. 3) is opposite to winding directions of the inner coil 58 and the outer coil 62 on the high frequency power transmission lines (counterclockwise direction in FIG. 2, and clockwise direction in FIG. 3) in the circumferential direction. In such a reverse-direction connection configuration, an electrostatic capacitance $C_{92}$ of the intermediate capacitor 92 may be adjusted within a certain range so as to allow a direction of a current flowing in the intermediate coil 60 to become equal to directions of currents flowing in the inner coil 58 and the outer coil 62 in the circumferential direction.

Further, as depicted in FIG. 2, within the antenna chamber 56 (FIG. 1), the connection conductors 98, 100, 102(1), 102(2), 104(1), 104(2), 106(1), 106(2), 106(3), 108(1), 108(2) and 108(3) upwardly extending from the RF antenna 54 serve as branch lines or connecting lines in horizontal directions while spaced apart from the dielectric window 52 at a sufficiently large distance (i.e., at considerably high positions). Accordingly, electromagnetic influence upon the coils 58, 60 and 62 can be reduced.

In accordance with the present embodiment, the two intermediate coil segments 61(1) and 61(2) of the intermediate coil 60 may have substantially the same self-inductance. Further, the three outer coil segments 63(1), 63(2) and 63(3) of the outer coil 62 may also have substantially same self-inductance. Furthermore, the inner coil segment 59 of the inner coil 58 may have the substantially same self-inductance as those of the intermediate coil segments 61(1) and 61(2) and the outer coil segments 63(1), 63(2) and 63(3). Typically, by using the coil segments 59, 61(1), 61(2), 63(1), 63(2) and 63(3) having the same materials, thicknesses and lengths, the self-inductances of the coil segments 59, 61(1), 61(2), 63(1), 63(2) and 63(3) can be set to be same or approximate to each other.

Further, if the lengths of the inner coil segment 59, each of the intermediate coil segments 61(1) and 61(2) and each of the outer coil segments 63(1), 63(2) and 63(3) are same, a diameter ratio between the inner coil 58, the intermediate coil 60 and the outer coil 62 becomes about 1:2:3. For example, when a semiconductor wafer W to be processed has a diameter of about 300 mm, diameters of the inner coil 58, the intermediate coil 60 and the outer coil 62 may be set to be about 100 mm, about 200 mm and about 300 mm.

In the inductively coupled plasma etching apparatus in accordance with the embodiment, the high frequency current supplied from the high frequency power supply unit flows through each component within the RF antenna 54. As a result, high frequency AC self-fields distributed in loop shapes are formed around the inner coil 58, the intermediate coil 60 and the outer coil 62 of the RF antenna according to the Ampere's Law. Further, under the dielectric window 52, magnetic force lines passing through the processing space in the radial direction are formed even in a relatively lower region.

In this case, a diametric directional (horizontal) component of a magnetic flux density in the processing space may be zero (0) constantly at a central region and a periphery of the chamber 10 regardless of a magnitude of the high frequency current. Further, the radial directional (horizontal) component of a magnetic flux density in the processing space may have a maximum value at a certain portion therebetween. A strength distribution of the induced electric field in the azimuth direction generated by the AC magnetic field of the high frequency may have the same pattern as a magnetic flux density distribution in a diametrical direction. That is, an electron density distribution within the donut-shaped plasma in the diametrical direction may substantially correspond to a current split within the RF antenna 54 in a macro view.

The RF antenna 54 of the present embodiment is different from a typical spiral coil wound from its center or inner peripheral end to an outer peripheral end thereof. That is, the RF antenna 54 includes the circular ring-shaped inner coil 58 localized to the central portion of the antenna; the circular ring-shaped intermediate coil 60 localized to the intermediate portion of the antenna; and the circular ring-shaped outer coil 62 localized to a peripheral portion of the antenna. A current split in the RF antenna 54 may be concentrated in the vicinities of each of the coils 58, 60 and 62.

Here, as mentioned above, the inner coil 58 includes the single circular-ring shaped coil segment 59 within the RF antenna 54. Accordingly, when plasma is generated, a high frequency current $I_i$ may be regular or uniform over the loop of the inner coil 58. Further, the two intermediate coil segments 61(1) and 61(2) of the intermediate coil 60 have substantially the same self-inductance (i.e., substantially the same impedance) and are electrically connected in parallel to each other. Accordingly, when plasma is generated, a high frequency current $I_m$ may be regular or uniform over the loop of the intermediate coil 60. Furthermore, the three outer coil segments 63(1), 63(2) and 63(3) of the outer coil 62 also have substantially the same self-inductance (i.e., substantially the same impedance) and are electrically connected in parallel to each other. Accordingly, when plasma is generated, a high frequency current $I_o$ may be regular or uniform over the loop of the outer coil 62.

Therefore, in the donut-shaped plasma generated below (inside) the dielectric window 52 of the chamber 10, a current density (i.e. plasma density) may be remarkably increased (maximized) at positions right below the inner coil 58, the intermediate coil 60 and the outer coil 62. Thus, a current density distribution within the donut-shaped plasma may not be uniform in a diametrical direction and may have an uneven profile. However, since the plasma is diffused in all directions within the processing space of the chamber 10, a plasma density in a vicinity of the susceptor 12, i.e. on the substrate W, may become very uniform.

In the present embodiment, the inner coil 58, the intermediate coil 60 and the outer coil 62 have the circular ring shapes. Further, since a regular or uniform high frequency currents flow in the circumferential directions of the coils, a plasma density distribution can constantly be uniformized in the circumferential directions of the coils in the vicinity of the susceptor 12, i.e., on the substrate W as well as within the donut-shaped plasma.

Further, in the radial direction, by varying and setting the electrostatic capacitances $C_{92}$ and $C_{94}$ of the intermediate capacitor 92 and the outer capacitor 94 to appropriate values within certain ranges, it is possible to adjust a balance between the currents $I_i$, $I_m$ and $I_o$ flowing in the inner coil 58, the intermediate coil 60 and the outer coil 62, respectively. Accordingly, plasma density distribution within the donut-shaped plasma can be controlled as desired. Thus, plasma density distribution in the vicinity of the susceptor 12, i.e., on the substrate W can be controlled as desired, and plasma density distribution can be easily uniformized with high accuracy. Here, the currents flowing in the inner coil 58, the intermediate coil 60 and the outer coil 62 will be referred to as an "inner current", an "intermediate current" and an "outer current", respectively.

In accordance with the present embodiment, each of the coils 58, 60 and 62 within the RF antenna 54 includes a single or a multiple number of coil segments. Regardless of the number of the coil segments of each of the coils 58, 60 and 62, all the coil segments 59, 61(1), 61(2), 63(1), 63(2) and 63(3) of the RF antenna 54 are all electrically connected in parallel. In such a coil segment connection configuration, a wavelength effect or a voltage drop within the RF antenna 54 may depend on the length of each of the coil segments 59, 61(1), 61(2), 63(1), 63(2) and 63(3).

Accordingly, the length of the inner coil segment 59 of the inner coil 58, the lengths of the intermediate coil segments 61(1) and 61(2) of the intermediate coil 60, and the lengths of the outer coil segments 63(1), 63(2) and 63(3) of the outer coil 62 may be set so as not to allow the occurrence of the wavelength effect within the individual coil segments 59, 61(1), 61(2), 63(1), 63(2) and 63(3), and also so as not to increase the voltage drop. In this way, the problems of the wavelength effect and voltage drop within the RF antenna 54 can be all resolved. For suppressing the wavelength effect, it may be desirable to set the length of each of the coil segments 59, 61(1), 61(2), 63(1), 63(2) and 63(3) to be shorter (more desirably, much shorter) than about ¼ of a wavelength of the high frequency power $RF_H$.

Figure 4:
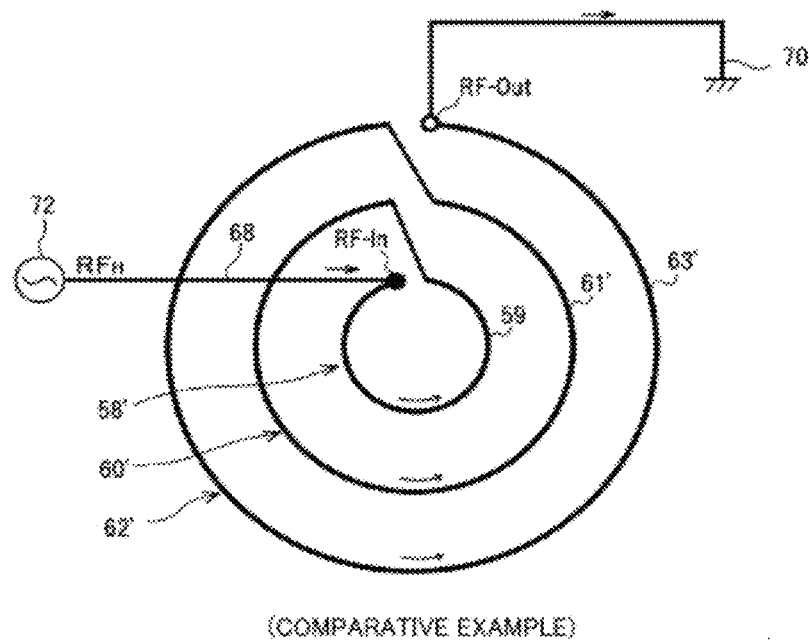
FIG. 4 is a diagram illustrating a basic layout and an electric connection of a RF antenna in accordance with a comparative example.

Further, the effect of reducing the voltage drop within the RF antenna of the present embodiment can be easily verified as compared to a comparative example as shown in FIG. 4. A RF antenna of the comparative example includes circular ring-shaped inner coil 58', intermediate coil 60' and outer coil 62' concentrically arranged at an inner side, an intermediate side and an outer side of the RF antenna in a radial direction. Here, the inner coil 58' is the same as the inner coil 58 of the present embodiment and includes a single coil segment 59. The intermediate coil 60' and the outer coil 62' are, however, different from the intermediate coil 60 and the outer coil 62 of the present embodiment. Further, the intermediate coil 60' includes a single coil segments 61' having a length twice the length of the coil segment 59, and the outer coil 62' includes a single coil segment 63' having a length three times the length of the coil segment 59, respectively. Furthermore, in the RF antenna of the comparative example, these three coils are connected in series to allow high frequency currents having the same magnitude to flow through the inner coil 58', the intermediate coil 60' and the outer coil 62'.

Now, to facilitate understanding of a voltage drop reducing effect within the RF antenna of the present embodiment, the RF antenna 54 of the present embodiment will be compared with a comparative example (FIG. 4) while omitting the capacitors 92 and 94.

In the RF antenna of the comparative example, if inductance of the inner coil 58' (coil segment 59) is, e.g., about 400 nH when plasma is generated, the inductances of the intermediate coil 60' (coil segment 61') and the outer coil 62' (coil segment 63') are about 800 nH and about 1200 nH, respectively, and the entire inductance of the RF antenna becomes about 2400 nH. Accordingly, if a high frequency current of about 20 A (having a frequency of about 13.56 MHz) flows through each coil of the RF antenna, a potential difference (voltage drop) of about 4 kV is generated within the RF antenna.

Figure 5:
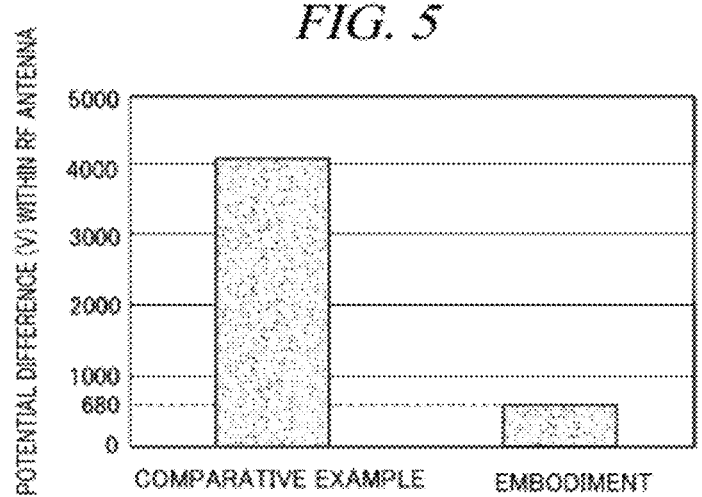
FIG. 5 is a graph comparing potential differences (voltage drops) generated in the RF antenna in accordance with the embodiment and the RF antenna in accordance with the comparative example.

In comparison, in the RF antenna 54 of the present embodiment, if the inductance of the inner coil 58 (inner coil segment 59) is about 400 nH when plasma is generated, the inductances of the intermediate coil segments 61(1) and 61(2) of the intermediate coil 60 and the inductances of the outer coil segments 63(1), 63(2) and 63(3) of the outer coil are also about 400 nH, respectively, and the entire inductance of the RF antenna becomes about 67 nH. Accordingly, when a high frequency current of about 20 A (having a frequency of about 13.56 MHz) flows through each coil of the RF antenna 54, a potential difference (voltage drop) generated within the RF antenna 54 (i.e., within each coil segment) may be about 680 V, which is equivalent to about ⅙ of the potential difference in the comparative example, as depicted in FIG. 5. Further, in the above calculation for the comparison, impedance of resistance within the RF antenna is ignored for the simplicity of explanation and for the sake of understanding.

As described above, in the RF antenna 54 of the present embodiment, it is difficult for the wavelength effect to occur and the potential difference (voltage drop) generated within the antenna becomes small. Thus, by capacitive coupling between the RF antenna 54 and the plasma, a difference in ion impacts on respective parts of the dielectric window 52 can be reduced. Hence, it is also possible to achieve an effect of reducing an undesirable phenomenon that a part of the dielectric window 52 is locally or intensively etched.

[Functions of Capacitor Added to RF Antenna]

Another important feature of the inductively coupled plasma etching apparatus in accordance with the present embodiment includes a function of a capacitor (especially, the intermediate capacitor 92) added to the RF antenna 54.

In the inductively coupled plasma etching apparatus of the present embodiment, by varying the electrostatic capacitance $C_{92}$ of the intermediate capacitor 92, a combined reactance of the intermediate coil 60 and the intermediate capacitor 92 (hereinafter, referred to as an "intermediate combined reactance") $X_m$ can be varied, and a magnitude of the intermediate current $I_m$ flowing in the intermediate coil 60 can also be varied.

Here, there is a desirable range for variation of the electrostatic capacitance $C_{92}$. That is, since the intermediate coil 60 is connected in the opposite direction against those of the inner coil 58 and the outer coil 62 with respect to the high frequency power supply unit 66 as stated above, it may be desirable to vary and set the electrostatic capacitance $C_{92}$ of the intermediate capacitor 92 so as to allow the intermediate combined reactance $X_m$ to have a negative value (i.e., so as to allow a capacitive reactance of the intermediate capacitor 92 to be larger than an inductive reactance of the intermediate coil 60). In the other aspect, it may be desirable to vary and set the electrostatic capacitance $C_{92}$ of the intermediate capacitor 92 within a range smaller than an electrostatic capacitance that allows a series resonance to occur in a serial circuit including the intermediate coil 60 and the intermediate capacitor 92.

As state above, in the RF antenna 54 in which the intermediate coil 60 is connected in the opposite direction against those of the inner coil 58 and the outer coil 62, the electrostatic capacitance $C_{92}$ of the intermediate capacitor 92 is varied within the range in which the intermediate combined reactance $X_m$ has a negative value. Thus, the direction of the intermediate current $I_m$ flowing in the intermediate coil 60 becomes equal to the directions of the inner current $I_i$ and the outer current $I_o$ flowing in the inner coil 58 and the outer coil 62 in the circumference direction, respectively. Further, the intermediate current $I_m$ may be gradually increased from about zero. By way of example, the intermediate current $I_m$ may be set to be equal to or smaller than about 1/10 of the inner current $I_i$ and the outer current $I_o$.

Further, it is verified by an experiment that if the intermediate current $I_m$ is set to be equal to or smaller than about 1/10 of the inner current $I_i$ and the outer current $I_o$, plasma density within the donut-shaped plasma can be uniformized effectively.

Even when the intermediate coil 60 is not provided, plasma generated at positions directly under the inner coil and the outer coil 62 may be diffused in the radial direction. Thus, plasma having a considerably high density may exist in a region between the two coils 58 and 62 as indicated by dashed lines in FIG. 3. Accordingly, if the small amount of the current $I_m$ flows independently through the intermediate coil 60 between the two coils 58 and 62 in the same circumferential direction as those of the currents $I_i$ and $I_o$ flowing in the two coils 58 and 62, respectively, inductively coupled plasma may be generated to be appropriately increased near a region directly under the intermediate coil 60. As a result, plasma density can be uniformed in the radial direction.

In the present embodiment, in order to set the intermediate current $I_m$ flowing in the intermediate coil 60 to be of a sufficiently small value, the intermediate coil 60 is connected in the opposite direction against those of the inner coil 58 and the outer coil 62, and the electrostatic capacitance $C_{92}$ of the intermediate capacitor is varied within the range in which the intermediate combined reactance $X_m$ has the negative value. In such a case, as the value of the $C_{92}$ is decreased within the range of $X_m<0$, an absolute value of the intermediate combined reactance $X_m$ would be increased. As a result, the intermediate current $I_m$ is decreased (close to zero). Meanwhile, as the value of the $C_{92}$ is increased within the range of $X_m<0$, the absolute value of the intermediate combined reactance $X_m$ would be decreased. As a result, the intermediate current $I_m$ is increased.

Alternatively, it may be also possible to vary the electrostatic capacitance $C_{92}$ of the intermediate capacitor within a range in which the intermediate combined reactance $X_m$ has a positive value. In this case, the intermediate current $I_m$ in the intermediate coil 60 would flow in the opposite direction against those of the inner current $I_i$ and the outer current $I_o$ in the inner coil 58 and the outer coil 62, respectively. This configuration may be applicable when plasma density needs to be reduced near a region directly under the intermediate coil 60 intentionally.

The outer capacitor 94 added to the RF antenna 54 functions to adjust a balance between the inner current $I_i$ flowing in the inner coil 58 and the outer current $I_o$ flowing in the outer coil 62. As described above, the amount of the intermediate current $I_m$ flowing in the intermediate coil 60 is small and most of the high frequency current supplied from the high frequency power supply unit 66 to the RF antenna 54 is split to the inner coil 58 and the outer coil 62. Here, by varying the electrostatic capacitance $C_{94}$ of the outer capacitor 94, a combined reactance $X_O$ of the outer coil 62 and the outer capacitor 94 (hereinafter, referred to as an "outer combined reactance") can be varied, and, a split ratio between the inner current $I_i$ and the outer current $I_o$ can be also adjusted.

Furthermore, both of the inner coil 58 and the outer coil 62 are connected in a forward direction. Thus, in order to flow the inner current $I_i$ and the outer current $I_o$ in the same circumferential direction, the electrostatic capacitance $C_{94}$ of the outer capacitor 94 needs to be varied in a range in which the outer combined reactance $X_o$ has a positive value. In this case, as the value of $C_{94}$ is decreased within the range of $X_o>0$, the value of the outer combined reactance $X_o$ would be decreased. As a result, the value of the outer current $I_o$ would be increased relatively, whereas the inner current $I_i$ would be decreased relatively. Meanwhile, as the value of $C_{94}$ is increased within the range of $X_O>0$, the value of the outer combined reactance $X_o$ would be increased. As a consequence, the outer current $I_o$ would be decreased relatively, whereas the inner current $I_i$ would be increased relatively.

As described above, in the inductively coupled plasma etching apparatus of the present embodiment, by varying the electrostatic capacitance $C_{94}$ of the outer capacitor 94, the balance between the inner current $I_i$ flowing in the inner coil 58 and the outer current $I_o$ flowing in the outer coil 62 can be adjusted as desired. Furthermore, as stated above, by varying the electrostatic capacitance $C_{92}$ of the intermediate capacitor 92, the balance between the intermediate current $I_m$ flowing in the intermediate coil 60 and the inner current $I_i$ flowing in the inner coil 58 and the balance between the intermediate current $I_m$ flowing in the intermediate coil 60 and the outer current $I_o$ flowing in the outer coil 62 can also be adjusted as desired.

[Another Experimental Example or Modification Example of RF Antenna to which Capacitor is Added]

Figure 6:
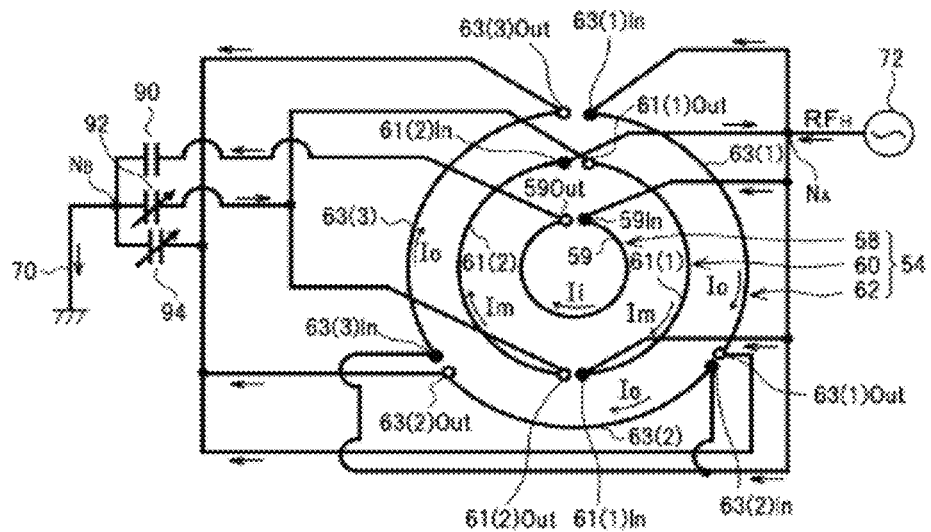
FIG. 6 is a diagram illustrating a configuration example in which a variable intermediate capacitor, a variable outer capacitor and a fixed inner capacitor are provided in the RF antenna in accordance with the embodiment.

As illustrated in FIG. 6, there may be further provided a fixed inner capacitor 90 having a fixed electrostatic capacitance in addition to the variable intermediate capacitor 92 and the variable outer capacitor having variable electrostatic capacitances as described above. In accordance with this configuration, a combined reactance $X_i$ of the inner coil 58 and the inner capacitor 90 (hereinafter, referred to as an "inner combined reactance") can be reduced, so that a control range by the outer capacitor 94 can be larger.

As another modification example, although not shown, it may be possible to employ variable capacitors as the intermediate capacitor 92 and the inner capacitor 90 while employing a fixed capacitor as the outer capacitor 94. Alternatively, it may be also possible to provide a variable intermediate capacitor 92 and a variable inner capacitor 90 while omitting the outer capacitor 94.

Figure 7:
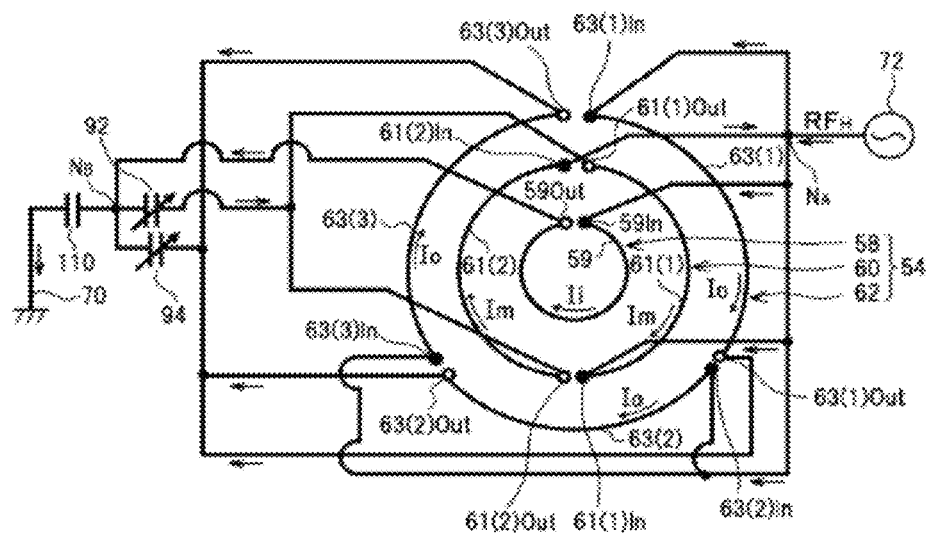
FIG. 7 is a diagram illustrating a configuration example in which an output side common capacitor is provided in the RF antenna.

As depicted in FIG. 7, provided on an end of the RF antenna 54, i.e., between the second node $N_B$ and the earth line 70 (or on the earth line 70) is an output side common capacitor 110 electrically connected in series to all the coil segments 59, 61(1), 61(2), 63(1), 63(2) and 63(3) within the RF antenna 54. Although the output side (end) common capacitor 110 may be typically a fixed capacitor, it may also be a variable capacitor.

The output side (end) common capacitor 110 has a function of adjusting the entire impedance of the RF antenna 54. Further, it also has a function of suppressing ion sputtering on the ceiling plate or the dielectric window 52 by increasing the entire electric potential (DC) of the RF antenna 54 from a ground potential.

Other capacitors than the output side common capacitor 110 may be provided on an input side of the RF antenna 54 (on the side of the first node $N_A$). By way of example, in a configuration example shown in FIG. 8, the intermediate capacitor 92 is connected between the first node $N_A$ and the intermediate coil 60, and the outer capacitor 94 is connected between the first node $N_A$ and the outer coil 62. In such a configuration in which the intermediate capacitor 92 and the outer capacitor 94 are provided on the input sides of the intermediate coil 60 and the outer coil 62, respectively, it can be avoided that the lengths of short-circuit resonance lines at both coils 60 and 62 are shortened. Thus, it is possible to securely prevent a wavelength effect from occurring.

Figure 8:
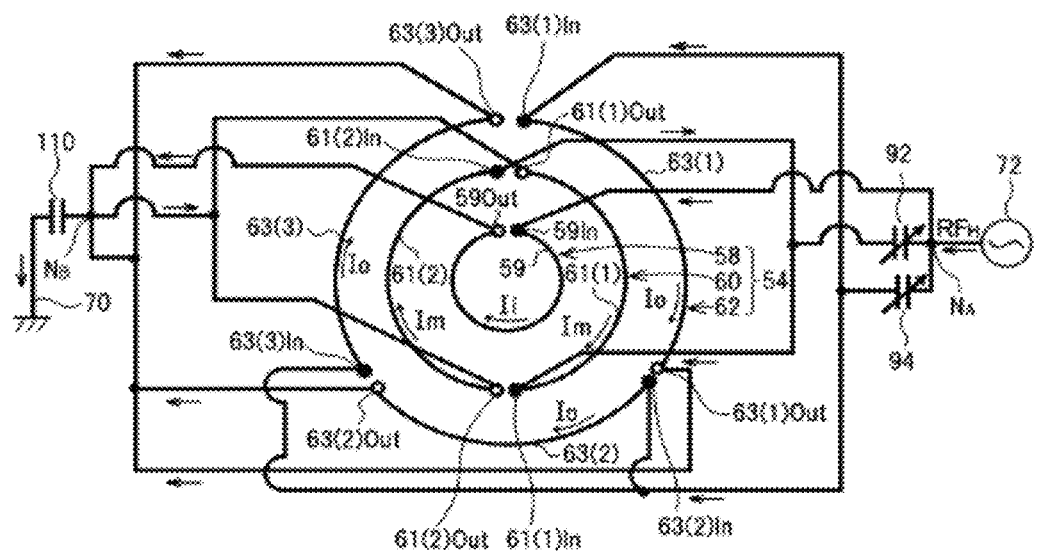
FIG. 8 is a diagram illustrating a configuration example in which an intermediate capacitor and an outer capacitor are provided on a high frequency input terminal in the RF antenna in accordance with the embodiment.
Figure 9:
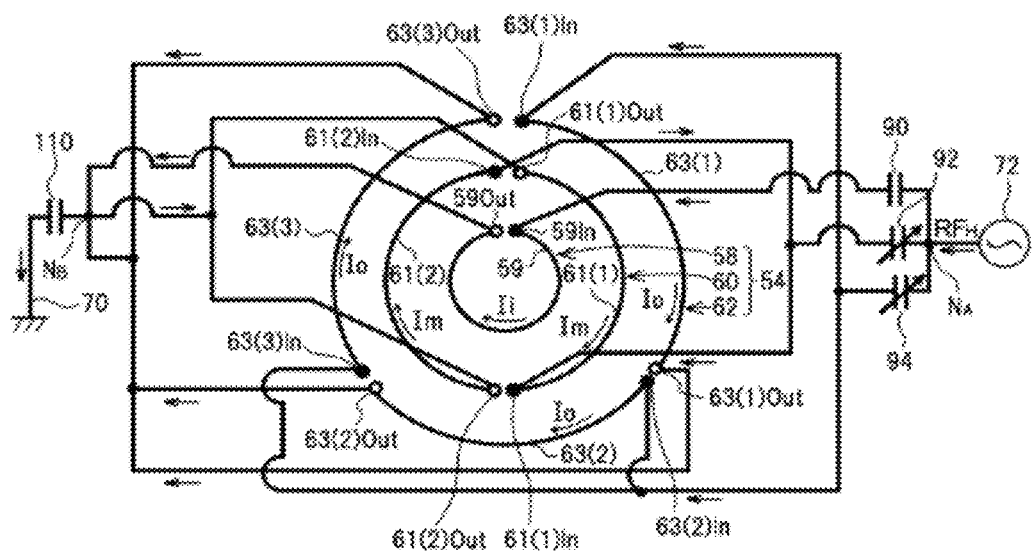
FIG. 9 is a diagram illustrating a modification example in which a fixed inner capacitor is added to the RF antenna of FIG. 8.

In FIG. 9, there is provided a modification example in which a fixed inner capacitor 90 is added to the configuration illustrated in FIG. 8. As shown in FIG. 9, the inner capacitor 90 is connected between the first node $N_A$ and the inner coil 58. In this configuration example, it is also possible to allow the control range by the outer capacitor 94 to be larger.

Figure 10:
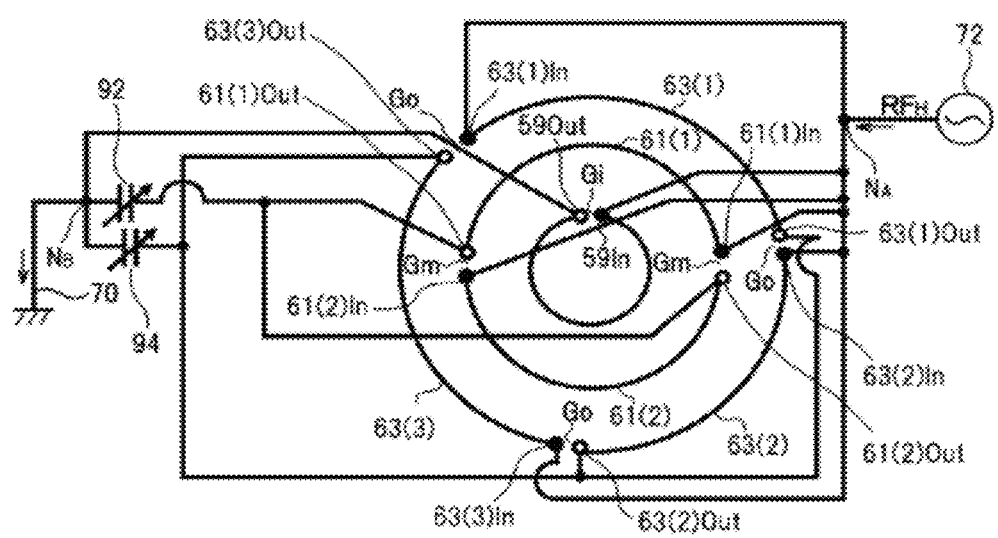
FIG. 10 is a diagram illustrating a configuration example in which an inner gap formed at an inner coil, intermediate gaps formed at an intermediate coil and outer gaps formed at an outer coil are arranged so as not to have a same azimuth angle.

In a configuration example depicted in FIG. 10, within the RF antenna 54, an inner gap $G_i$ (input terminal 59In/output terminal 59Out) formed at the inner coil 58, intermediate gaps $G_m$ (input terminal 61(1)In/output terminal 61(2)Out and input terminal 61(2)In/output terminal 61(1)Out) formed at the intermediate coil 60, outer gaps $G_o$ (input terminal 63(1)In/output terminal 63(3)Out, input terminal 63(2)In/output terminal 63(1)Out and input terminal 63(3) In/output terminal 63(2)Out are arranged so as not to have same azimuth angles.

If there exist gaps $G_i$, $G_m$ and $G_o$ within one loop of the coils 58, 60 and 62, an induced electromotive force cannot be applied to the plasma directly under the gaps. Accordingly, as in this configuration example, by allowing the positions of the gaps $G_i$, $G_m$ and $G_o$ to be deviated from each other in an azimuthal direction, nonuniform distribution of plasma density in the azimuthal direction can be reduced.

Figure 11:
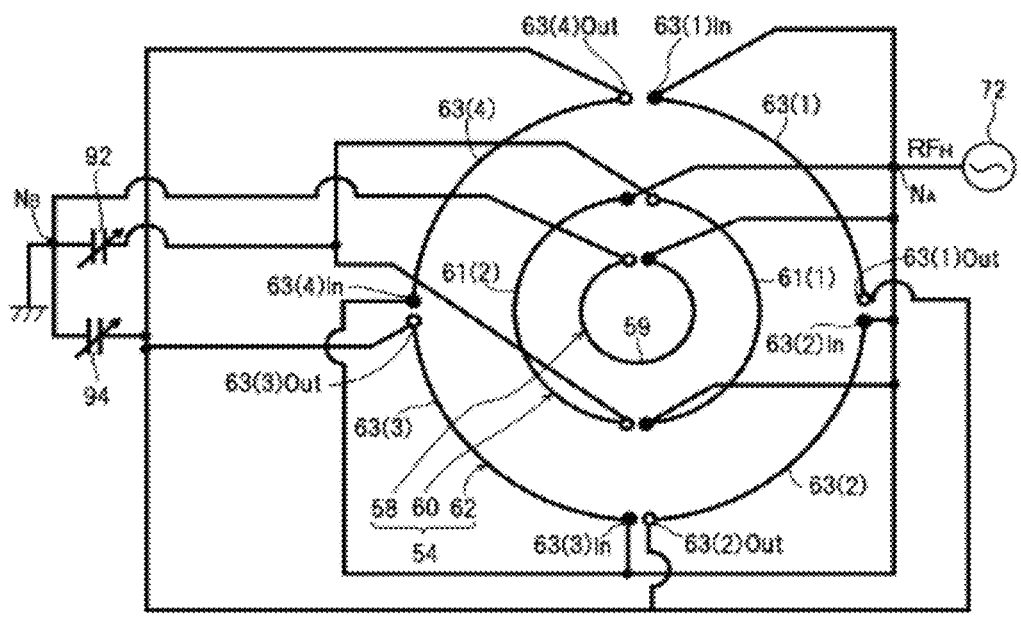
FIG. 11 is a diagram illustrating a configuration example in which an outer coil is divided into four coil segments in the RF antenna in accordance with the embodiment.

FIG. 11 illustrates a configuration example in which the outer coil 62 is divided into four coil segments 63(1), 63(2), 63(3) and 63(4). Each of these four coil segments 63(1), 63(2), 63(3) and 63(4) is spatially formed in about ¼ circular arc shape. Further, the four coil segments 63(1), 63(2), 63(3) and 63(4) are extended along one round in a circumferential direction or along the most of one round in the circumference direction. Electrically, the four coil segments 63(1), 63(2), 63(3) and 63(4) are connected in parallel to each other between the first node $N_A$ and the second node $N_B$.

Figure 12:
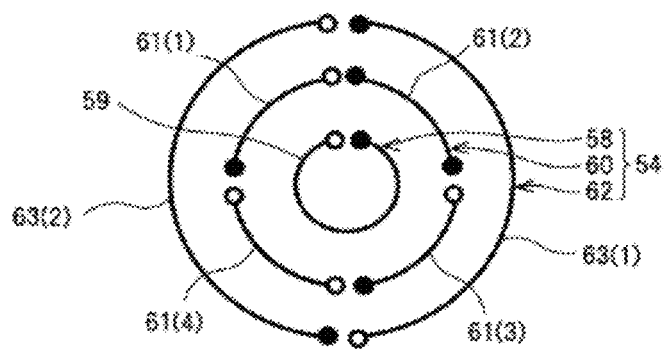
FIG. 12 is a diagram illustrating a configuration example in which an intermediate coil is divided into four intermediate coil segments and an outer coil is divided into two outer coil segments in the RF antenna in accordance with the embodiment.

In the RF antenna 54 in which each of the intermediate coil 60 and the outer coil 62 is divided into multiple number of coil segments, the number of the coil segments of each coil 60 (62) need not necessarily be proportional to a coil length ratio. Especially, when the RF antenna 54 includes the capacitors 92 and 94 for adjusting electric currents, the numbers of division (the numbers of coil segments) of the intermediate coil 60 and the outer coil 62 can be selected independently. By way of example, as shown in FIG. 12, the intermediate coil 60 may be divided into four intermediate coil segments 61(1), 61(2), 61(3) and 61(4), while the outer coil segments 62 is divided into two outer coil segments 63(1) and 63(2).

Figure 13:
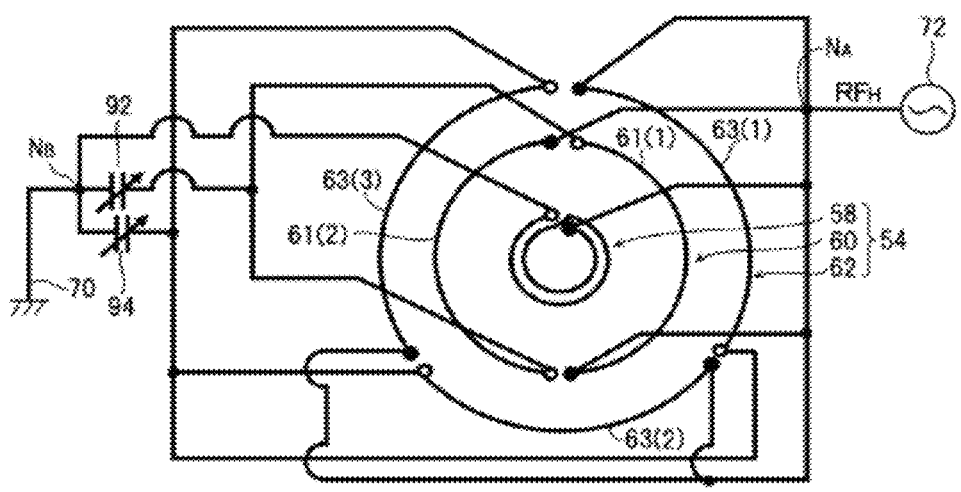
FIG. 13 is a diagram illustrating a configuration example in which an inner coil is wound in two turns and each of an intermediate coil and an outer coil is wound in one turn in the RF antenna in accordance with the embodiment.
Figure 14:
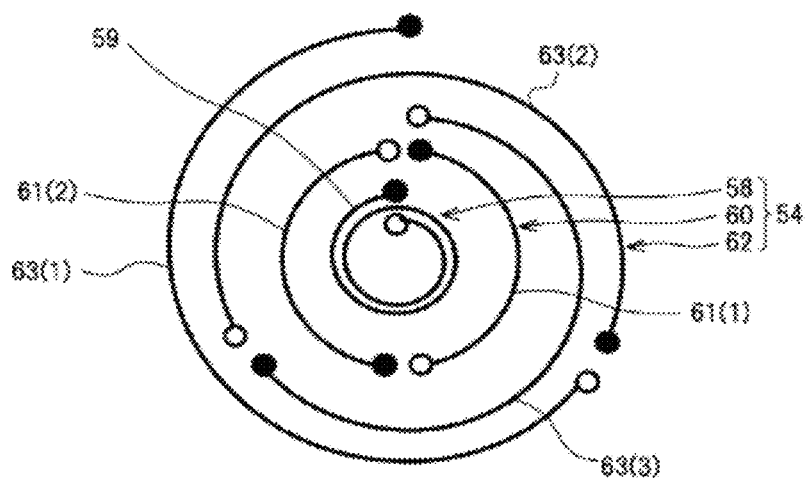
FIG. 14 is a diagram illustrating a configuration example in which an intermediate coil is wound in one turn and each of an inner coil and an outer coil is wound in two turns in the RF antenna in accordance with the embodiment.

In accordance with the RF antenna 54 of the present embodiment, each of the coils 58, 60 and 62 may not be wound in a single turn but may be wound in multiple turns. For example, as shown in FIG. 13, the inner coil 58 may be wound in two turns and each of the intermediate coil 60 and the outer coil 62 may be wound in a single turn. Alternatively, although not shown, each of the inner coil 58 and the intermediate coil 60 may be wound in a single turn and the outer coil 62 may be wound in two turns. Further alternatively, each of the inner coil 58 and the outer coil 62 may be wound in two turns.

As stated above, by increasing the winding number of the inner coil 58 and/or the outer coil 62, a coil magnetomotive force (ampere-turn), which determines plasma density in a region near positions directly under the coils, can be increased. Further, as much as the coil magnetomotive force is increased, the inner current $I_i$ and/or the outer current $I_o$ can be reduced, so that a power loss can be reduced (i.e., plasma generation efficiency can be improved).

Figure 15A:
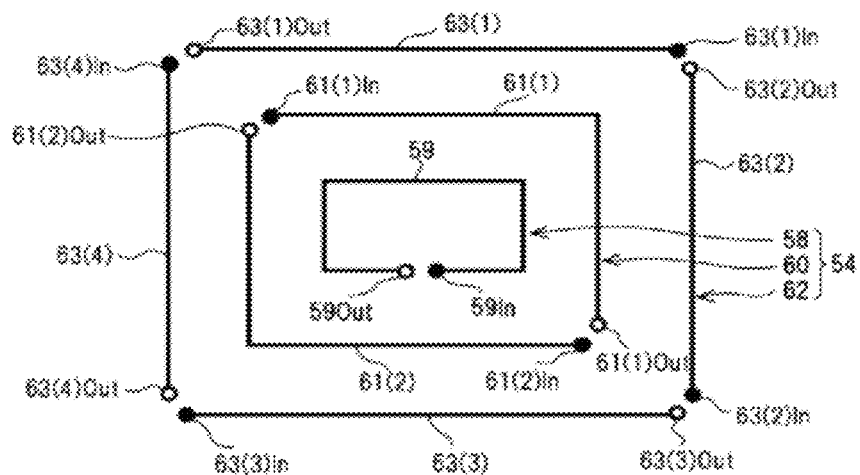
FIG. 15A is a diagram illustrating a configuration example in which each coil of the RF antenna in accordance with the embodiment has a rectangular loop shape.
Figure 15B:
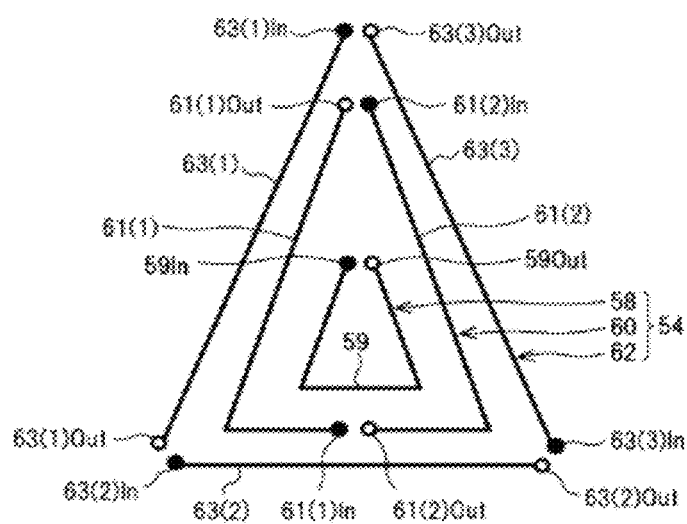
FIG. 15B is a diagram illustrating a configuration example in which each coil of the RF antenna in accordance with the embodiment has a triangular loop shape.

In accordance with the RF antenna 54 of the present embodiment, the loop of each of the coils 58, 60 and 62 may not be of a circular shape but may be of, but not limited to, a rectangular shape as illustrated in FIG. 15A or a triangular shape as illustrated in FIG. 15B, depending on the shape of the processing target object. Even when the coils 58, 60 and 62 have such polygonal loop shapes, it may be desirable to connect the intermediate coil 60 in the opposite direction against those of the inner coil 58 and the outer coil 62, and to provide an intermediate capacitor (not shown). Furthermore, the multiple number of coil segments of each coil (loop) may have different shapes or different self-impedances. A cross sectional shape of the coil or coil segment may not be limited to a rectangular shape or may be a circular or an ellipse shape. Further, the coil may be a single wire or a stranded wire.

Figure 16:
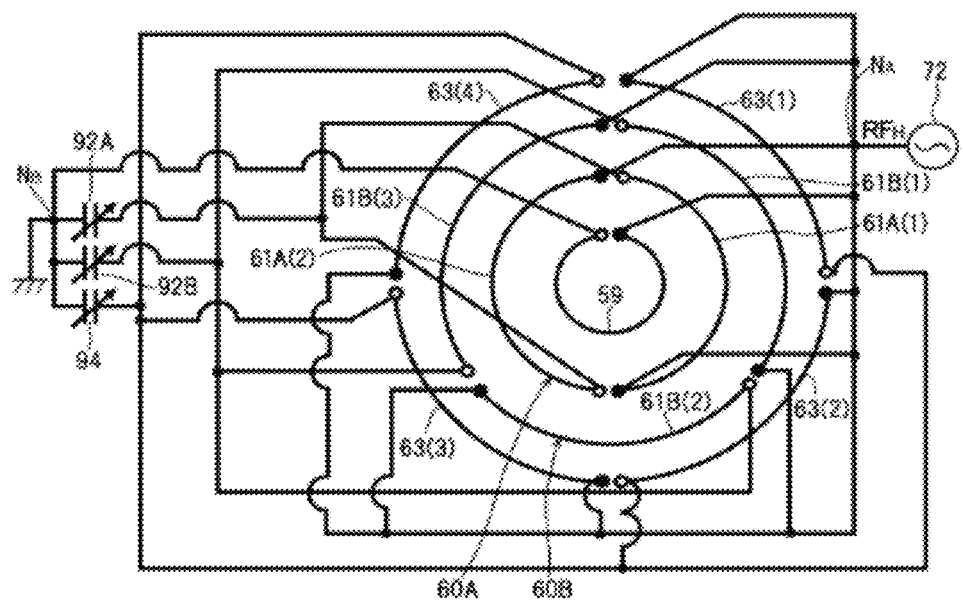
FIG. 16 is a diagram illustrating a configuration example in which two intermediate coils each having different diameter are provided between an inner coil and an outer coil in the RF antenna in accordance with the embodiment.

In a configuration example shown in FIG. 16, two intermediate coils 60A and 60B having different diameters are provided between the inner coil 58 and the outer coil 62. To be more specific, the first intermediate coil 60A having a smaller diameter may be divided into two intermediate coil segments 61A(1) and 61A(2). The second intermediate coil 60B having a larger diameter is divided into three intermediate coil segments 61B(1), 61B(2) and 61B(3). The outer coil 62 is divided into four outer coil segments 63(1), 63(2), 63(3) and 63(4). By way of example, the diameters of the inner coil 58, the first intermediate coil 60A, the second intermediate coil 60B and the outer coil 62 may be set to about 100 mm, about 200 mm, about 300 mm and about 400 mm, respectively.

In this way, in accordance with the RF antenna 54 of the present embodiment, a multiple number of intermediate coils 60 (60A, 60B, . . . ) can be arranged between the inner coil 58 having the smallest diameter and the outer coil 62 having the largest diameter. Further, as shown in FIG. 16, when the multiple number of, e.g., two intermediate coils 60A and 60B are provided, it may be desirable to connect a first intermediate capacitor 92A and a second intermediate capacitor 92B to the first intermediate coil 60A and the second intermediate coil 60B in series, respectively.

Figure 17:
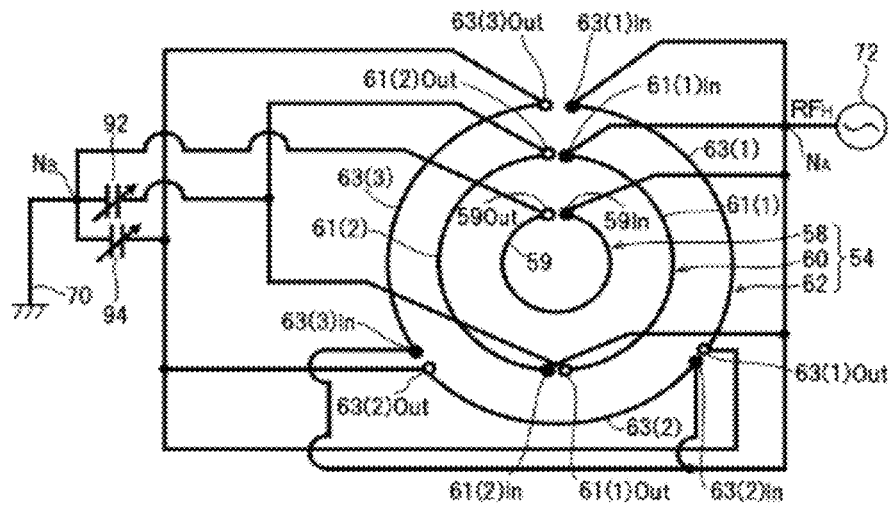
FIG. 17 is a diagram illustrating a configuration example in which an intermediate coil is provided in the same direction (forward direction) as those of an inner coil and an outer coil in the RF antenna in accordance with the embodiment.

In a configuration example shown in FIG. 17, the intermediate coil 60 is connected in the same direction (forward direction) as those of the inner coil 58 and the outer coil 62. That is, when a high frequency transmission lines are continuously extended from the first node $N_A$ to the second node $N_B$, a winding direction of the intermediate coil 60 on the high frequency power transmission line is equal to winding directions of the inner coil 58 and the outer coil 62 on the high frequency power transmission lines (clockwise directions in FIG. 17) in the circumferential direction.

In such a case, when the electrostatic capacitance $C_{92}$ of the intermediate capacitor 92 is varied within a range in which the intermediate combined reactance $X_m$ has a positive value, the intermediate current $I_m$ can be varied in the same direction as those of the inner current $I_i$ and the outer current $I_o$ in the circumferential direction. That is, as the value of the $C_{92}$ is decreased within the range of $X_m > 0$, a value of the intermediate combined reactance $X_m$ would be decreased. As a result, the intermediate current $I_m$ is increased. Meanwhile, as the value of the $C_{92}$ is increased within the range of $X_m > 0$, the value of the intermediate combined reactance $X_m$ would be increased. As a result, the intermediate current $I_m$ is decreased. However, even if the $C_{92}$ is increased indefinitely, the intermediate combined reactance $X_m$ may not fall below an inductive reactance of the intermediate coil 60. Thus, the value of the intermediate current $I_m$ cannot be minimized (close to zero). For the reason, by a typical method, it may be difficult to control the intermediate current $I_m$ to be equal to or less than about 1/10 of the inner current $I_i$ and the outer current $I_o$.

Meanwhile, in a configuration example shown in FIG. 17, the electrostatic capacitance $C_{92}$ of the intermediate capacitor 92 may be varied within a range in which the combined reactance $X_m$ has a negative value. In such a case, the flowing direction of the intermediate current $I_m$ becomes opposite to the flowing directions of the inner current $I_i$ and the outer current $I_o$ in the circumferential direction. This configuration may be applicable when plasma density needs to be reduced near a region directly under the intermediate coil 60 intentionally.

Figure 18A:
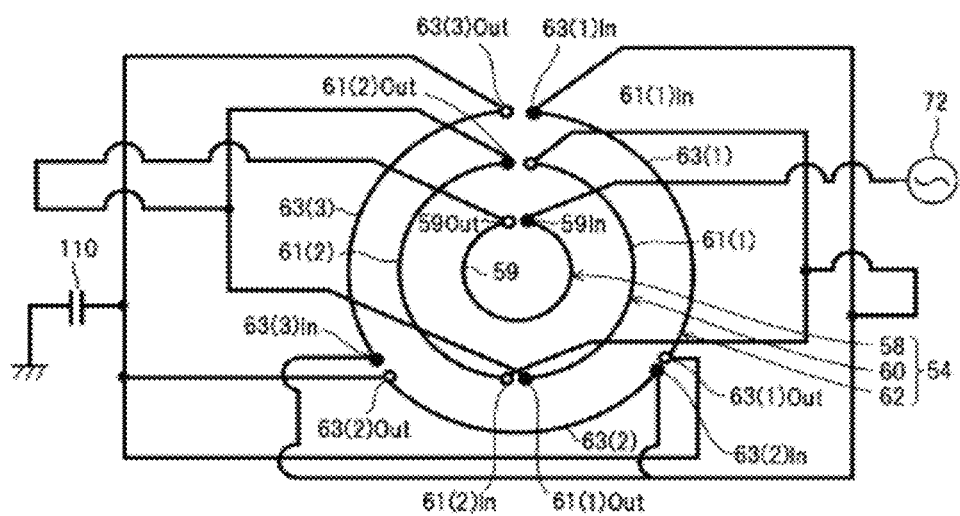
FIG. 18A is a diagram illustrating a configuration example in which all coils of the RF antenna are connected in series in accordance with the embodiment.
Figure 18B:
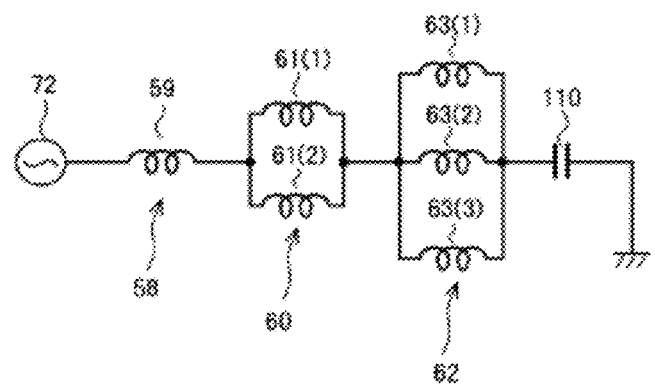
FIG. 18B is an electric circuit diagram illustrating the configuration example of FIG. 18A.

In a configuration example shown in FIGS. 18A and 18B, the inner coil 58, the intermediate coil 60 and the outer coil 62 are electrically connected in series within the RF antenna 54. Here, within the intermediate coil 60 and the outer coil 62, each of the intermediate coil segments 61(1) and 61(2) and each of the outer coil segments 63(1), 63(2) and 63(3) are electrically connected in parallel. Thus, an entire effective length of the RF antenna 54 may be equivalent to the lengths of only three coil segments. In this way, in the configuration in which all the coils 58, 60 and 62 within the RF antenna 54 are electrically connected in series, a current split within the RF antenna 54 can be reduced. Therefore, a high frequency current supplied to the RF antenna 54 can be reduced, and a RF power loss within the high frequency power supply unit 66 (especially, the matching unit 74) can be reduced.

Other Experimental Examples or Modification Examples

Figure 19:
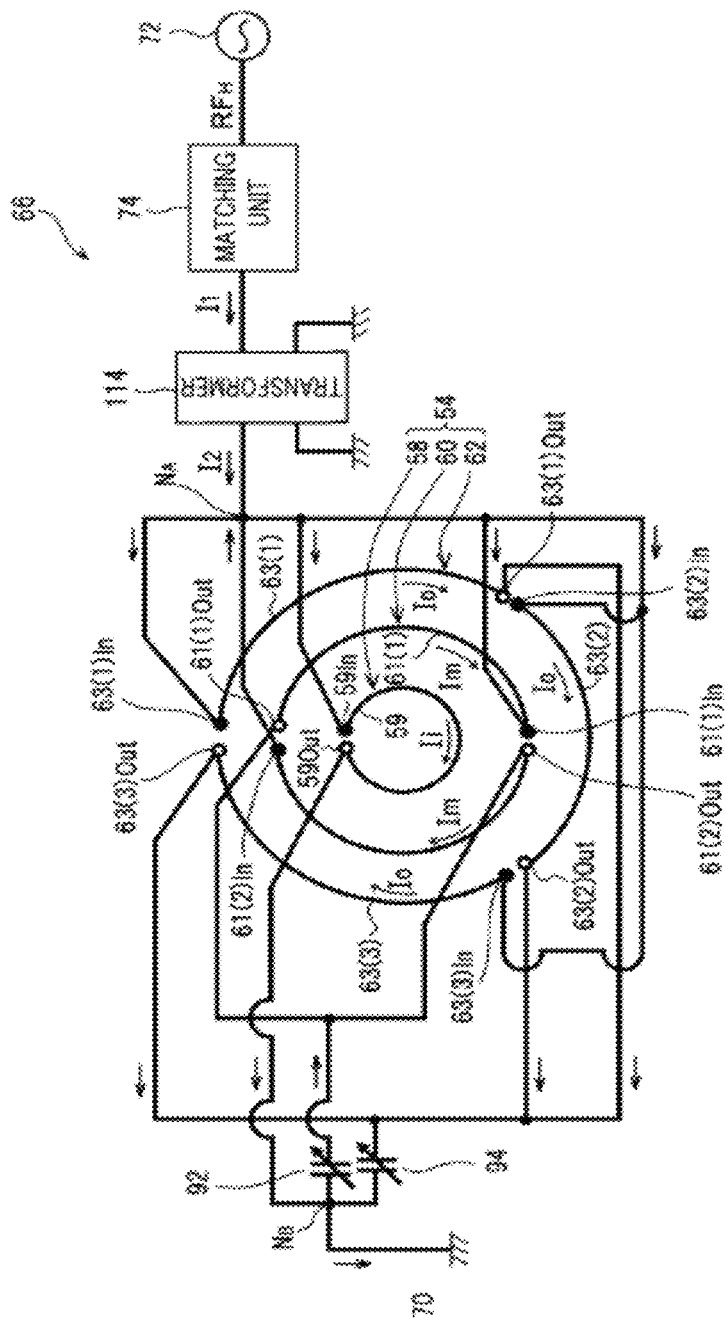
FIG. 19 is a diagram illustrating a configuration example in which a transformer is provided between a high frequency power supply unit and an RF antenna.

FIG. 19 shows a configuration example in which a transformer 114 is provided between the matching unit 74 of the high frequency power supply 66 and the RF antenna 54. A primary coil of the transformer 114 is electrically connected with an output terminal of the matching unit 74, while a secondary coil is electrically connected with the first node $N_A$ on the input terminal of the RF antenna 54. As a typical example of the transformer 114, by setting a winding number of the primary coil to be larger than a winding number of the secondary coil, an amount of a current (primary current) $I_1$ flowing from the matching unit 74 to the transformer 114 can be set be smaller than that of a secondary current $I_2$ flowing from the transformer 114 to the RF antenna 54. In another view point, the magnitude of the secondary current $I_2$ supplied to the RF antenna 54 can be increased without increasing the magnitude of the primary current $I_1$.

Figure 20:
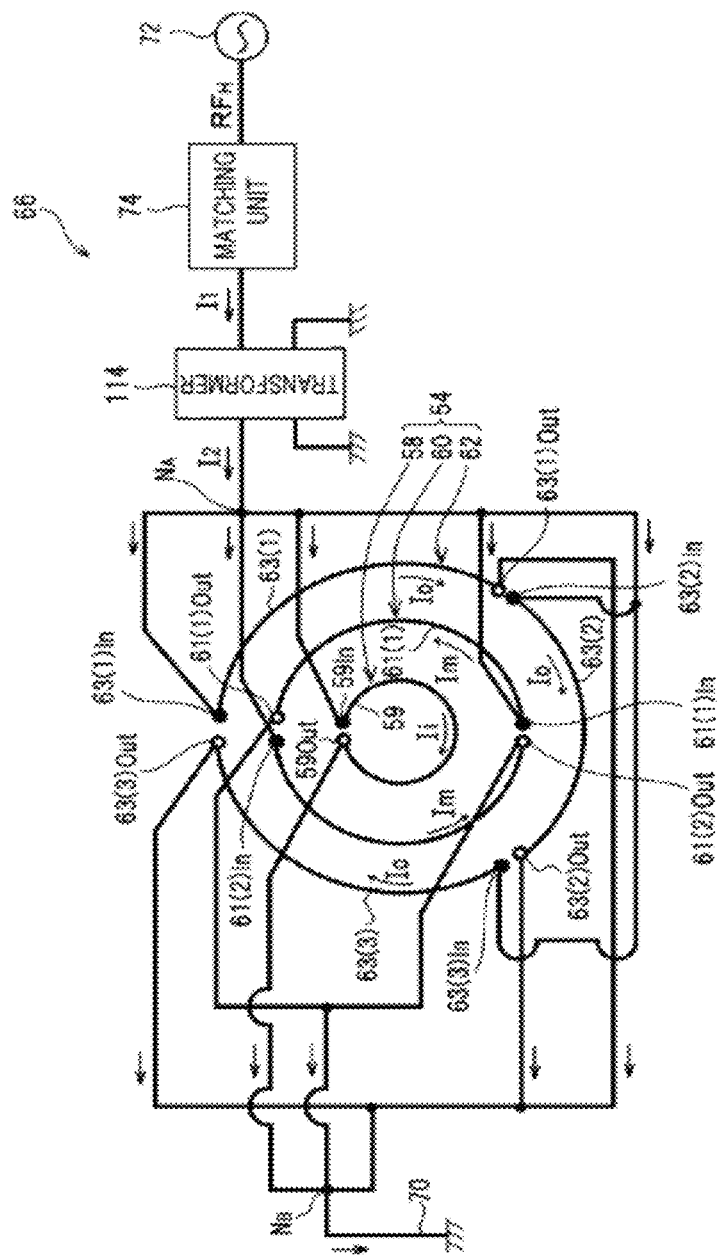
FIG. 20 is a diagram illustrating a configuration example in which no capacitor is provided in the RF antenna in accordance with the embodiment.

Further, when the transformer 114 is provided, it may be possible to vary the secondary current $I_2$ by performing tap switching on the secondary side of the transformer 114. In such a case, as illustrated in FIG. 20, all capacitors within the RF antenna 54 may be omitted.

In the above-described embodiment, the illustrated configuration of the inductively coupled plasma etching apparatus is nothing more than an example. Not only each component of the plasma generating mechanism but also each component which is not directly relevant to plasma generation can be modified in various manners.

By way of example, the basic shape of the RF antenna may be a dome shape besides the planar shape mentioned above. Further, it may be also possible to have configuration in which a processing gas is introduced into the chamber 10 from the processing gas supply unit through a ceiling. Furthermore, it may be also possible not to apply a high frequency power $RF_L$ for DC bias control to the susceptor 12.

The inductively coupled plasma processing apparatus or the inductively coupled plasma processing method of the present disclosure can be applied to, not limited to a plasma etching technology, other plasma processes such as plasma CVD, plasma oxidation, plasma nitridation, and sputtering. Further, the target substrate in the present disclosure may include, but is not limited to a semiconductor wafer, various kinds of substrates for a flat panel display or photo mask, a CD substrate, and a print substrate.

What is claimed is:

1. A plasma processing apparatus, comprising:
    a processing chamber having a dielectric window;
    a substrate holding unit for holding thereon a processing target substrate within the processing chamber;
    a processing gas supply unit configured to supply a processing gas into the processing chamber in order to perform a plasma process on the substrate;
    a RF antenna provided outside the dielectric window in order to generate plasma of the processing gas within the processing chamber by inductive coupling; and
    a high frequency power supply unit configured to supply a high frequency power having a frequency for generating a high frequency electric discharge of the processing gas,
    wherein the RF antenna includes only three coils consisting of an inner coil, an intermediate coil and an outer coil with gaps therebetween in a radial direction,
    the inner coil includes a single inner coil segment or more than one inner coil segments connected in series and disposed in a plane,
    the intermediate coil includes a plurality of intermediate coil segments separated in a circumferential direction and electrically connected with each other in parallel and disposed in said plane, and
    the outer coil includes a multiplicity of outer coil segments separated in a circumferential direction and electrically connected with each other in parallel and disposed in said plane, and
    wherein a variable intermediate capacitor is electrically connected with the plurality of intermediate coil segments in series between a first node on the side of the high frequency power supply unit and a second node on a ground potential side,
    a variable outer capacitor is electrically connected with the multiplicity of outer coil segments in series between the first and second nodes,
    the numbers of the intermediate coil segments and the numbers of the outer coil segments are selected independently, and
    connection conductors upwardly extending from the RF antenna are connected to each other in horizontal directions while spaced apart from the dielectric window at a predetermined distance to reduce electromagnetic influence upon the inner, intermediate and outer coils,
    when high frequency power transmission lines are extended continuously from the first node to the second node, a winding direction of the intermediate coil on the high frequency power transmission line is opposite to winding directions of the inner coil and the outer coil on the high frequency power transmission lines in the circumferential direction, the variable intermediate capacitor has an electrostatic capacitance having a range in which a combined reactance of the plurality of intermediate coil segments and the variable intermediate capacitor has a negative value, an output side common capacitor between the second node and an earth line is electrically connected in series to the inner, intermediate and outer coil segments such that the variable intermediate capacitor, the variable outer capacitor and the output side common capacitor are directly connected to second node, and the inner coil, the intermediate coil and the outer coil are electrically connected with each other in parallel between the first and second nodes.

2. The plasma processing apparatus of claim 1, wherein the inner coil segment is extended at least one round in a circumferential direction.

3. The plasma processing apparatus of claim 1, wherein a length of the inner coil segment is shorter than about ¼ of a wavelength of the high frequency power.

4. The plasma processing apparatus of claim 1, wherein the number of the outer coil segments is larger than the number of the intermediate coil segments.

5. The plasma processing apparatus of claim 1, wherein the outer coil segments are arranged so as to be extended along at least one round in the circumferential direction or along the most of the at least one round in the circumferential direction as a whole.

6. The plasma processing apparatus of claim 1, wherein a length of each outer coil segment is shorter than about ¼ of a wavelength of the high frequency power.

7. The plasma processing apparatus of claim 1, wherein the outer coil segments have the substantially same self-inductance.

8. The plasma processing apparatus of claim 1, wherein directions of electric currents flowing in the outer coil segments are the same in the circumferential direction.

9. The plasma processing apparatus of claim 1, wherein magnitudes of electric currents flowing in the outer coil segments are substantially same.

10. The plasma processing apparatus of claim 1, wherein the intermediate coil segments are arranged so as to be extended along at least one round in the circumferential direction or along the most of the at least one round in the circumferential direction as a whole.

11. The plasma processing apparatus of claim 1, wherein a length of each intermediate coil segment is shorter than about ¼ of a wavelength of the high frequency power.

12. The plasma processing apparatus of claim 1, wherein the intermediate coil segments have the substantially same self-inductance.

13. The plasma processing apparatus of claim 1, wherein directions of electric currents flowing in the intermediate coil segments are the same in the circumferential direction.

14. The plasma processing apparatus of claim 1, wherein magnitudes of electric currents flowing in the intermediate coil segments are substantially same.

15. The plasma processing apparatus of claim 1, wherein a direction of an electric current flowing in the inner coil, a direction of an electric current flowing in the intermediate coil and a direction of an electric current flowing in the outer coil are same in the circumferential direction.

16. The plasma processing apparatus of claim 1, wherein self-inductances of the inner, intermediate and outer coil segments are all substantially same.

17. The plasma processing apparatus of claim 1, wherein an electric current flowing in the intermediate coil segment is smaller than an electric current flowing in each inner coil segment and each outer coil segment.

18. The plasma processing apparatus of claim 1, wherein the variable outer capacitor has an electrostatic capacitance having a range in which a combined reactance of the multiplicity of outer coil segments and the variable outer capacitor has a positive value.

19. The plasma processing apparatus of claim 1, wherein the number of the intermediate coil is plural, and the intermediate coils are electrically connected with each other in parallel between the inner coil and the outer coil.

20. The plasma processing apparatus of claim 1, wherein the intermediate coil is wound one round and at least one of the inner coil and the outer coil is wound multiple rounds.

21. The plasma processing apparatus of claim 1, wherein the high frequency power supply unit includes:
   a high frequency power supply configured to supply the high frequency power;
   a matching unit for matching impedance on the side of the high frequency power supply and impedance on a load side; and
   a transformer having a primary coil electrically connected with an output terminal of the matching unit and a secondary coil electrically connected with the RF antenna.

22. The plasma processing apparatus of claim 1, wherein the dielectric window constitutes all or a part of a ceiling plate of the processing chamber, and
   the inner coil, the intermediate coil and the outer coil are provided on the dielectric window.

23. The plasma processing apparatus of claim 1, wherein the inner coil, intermediate coil and the outer coil are coaxially arranged.

24. The plasma processing apparatus of claim 1, wherein at least one inner gap formed at the inner coil, at least two intermediate gaps formed at the intermediate coil and at least two outer gaps formed at the outer coil are arranged so as not to have same azimuth angles.

* * * * *